(12) United States Patent
Nishiuchi et al.

(10) Patent No.: US 9,147,673 B2
(45) Date of Patent: Sep. 29, 2015

(54) SEMICONDUCTOR POWER CONVERTER AND METHOD OF MANUFACTURING THE SAME

(71) Applicant: Kabushiki Kaisha Toshiba, Tokyo (JP)

(72) Inventors: Hideo Nishiuchi, Kuwana (JP); Kazuhiro Ueda, Aisai (JP); Takayuki Masunaga, Yokkaichi (JP); Naotake Watanabe, Mie-gun (JP); Yoshiyuki Shimizu, Tokyo (JP); Takashi Togasaki, Yokohama (JP); Koji Maruno, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 14/025,019

(22) Filed: Sep. 12, 2013

(65) Prior Publication Data

US 2014/0117526 A1 May 1, 2014

(30) Foreign Application Priority Data

Oct. 31, 2012 (JP) .................................. 2012-240990
Jun. 28, 2013 (JP) .................................. 2013-137218

(51) Int. Cl.
*H01L 23/10* (2006.01)
*H01L 25/00* (2006.01)
(Continued)

(52) U.S. Cl.
CPC ............ *H01L 25/50* (2013.01); *H01L 21/4839* (2013.01); *H01L 21/4842* (2013.01); *H01L 23/473* (2013.01); *H01L 23/49562* (2013.01); *H01L 23/50* (2013.01); *H01L 25/072* (2013.01); *H01L 23/3107* (2013.01);
(Continued)

(58) Field of Classification Search
CPC ......... H01L 23/10; H01L 25/00; H01L 23/53; H01L 23/495; H01L 23/051; H01L 23/08
USPC .......................... 438/107, 121–127, 214, 280
See application file for complete search history.

(56) References Cited

U.S. PATENT DOCUMENTS 7,145,224 B2 *  12/2006  Kawashima et al. .......... 257/678
8,350,376 B2 *   1/2013  Hauenstein et al. .......... 257/691
(Continued)

FOREIGN PATENT DOCUMENTS

EP        2034521 A2      3/2009
EP        2101402 A2      9/2009
(Continued)

OTHER PUBLICATIONS

European Search Report issued in EP Patent Application No. 13183676.9, mailed Oct. 16, 2013, 5 pages.

*Primary Examiner* — Chuong A Luu
(74) *Attorney, Agent, or Firm* — Baker Botts L.L.P.

(57) ABSTRACT

According to one embodiment, a semiconductor power converter includes first and second electrical conductors opposed to each other, first and second semiconductor elements joined to a first joint surface of the first electrical conductor, first and second convex electrical conductors joined to the first and second semiconductor elements, a junction joined to the first and second convex electrical conductors and a second joint surface of the second electrical conductor, power terminals, signal terminals, and an envelope sealing the constituent members. The envelope includes a flat bottom surface which extends perpendicular to the semiconductor elements and in which first and second bottom surfaces of the electrical conductors are exposed.

8 Claims, 27 Drawing Sheets

(51) Int. Cl.
*H01L 23/50* (2006.01)
*H01L 25/07* (2006.01)
*H01L 23/473* (2006.01)
*H01L 23/495* (2006.01)
*H01L 21/48* (2006.01)
*H01L 23/40* (2006.01)
*H01L 23/31* (2006.01)

(52) U.S. Cl.
CPC .. *H01L 23/4006* (2013.01); *H01L 2224/48247* (2013.01); *H01L 2224/49171* (2013.01); *H01L 2924/1305* (2013.01); *H01L 2924/13055* (2013.01)

(56) References Cited

U.S. PATENT DOCUMENTS

| | | | |
|---|---|---|---|
| 8,884,411 B2* | 11/2014 | Kadoguchi et al. | 257/666 |
| 2003/0011054 A1* | 1/2003 | Jeun et al. | 257/678 |
| 2009/0045490 A1 | 2/2009 | Watanabe | |
| 2009/0057853 A1 | 3/2009 | Gerbsch et al. | |
| 2012/0242865 A1 | 9/2012 | Harry et al. | |

FOREIGN PATENT DOCUMENTS

| | | |
|---|---|---|
| JP | 2003258166 | 9/2003 |
| JP | 2007068302 | 3/2007 |

\* cited by examiner

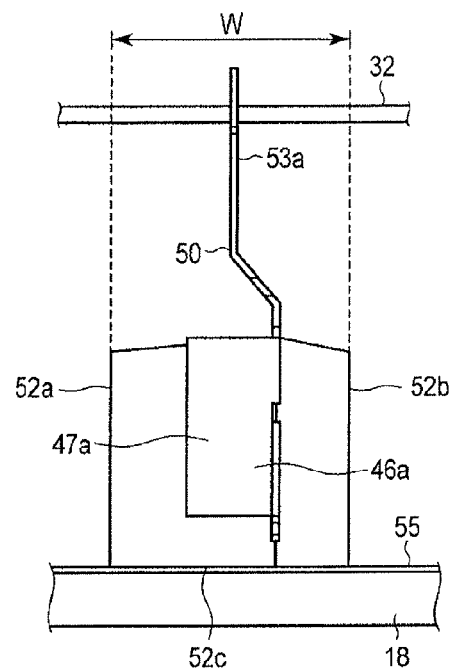
F I G. 10
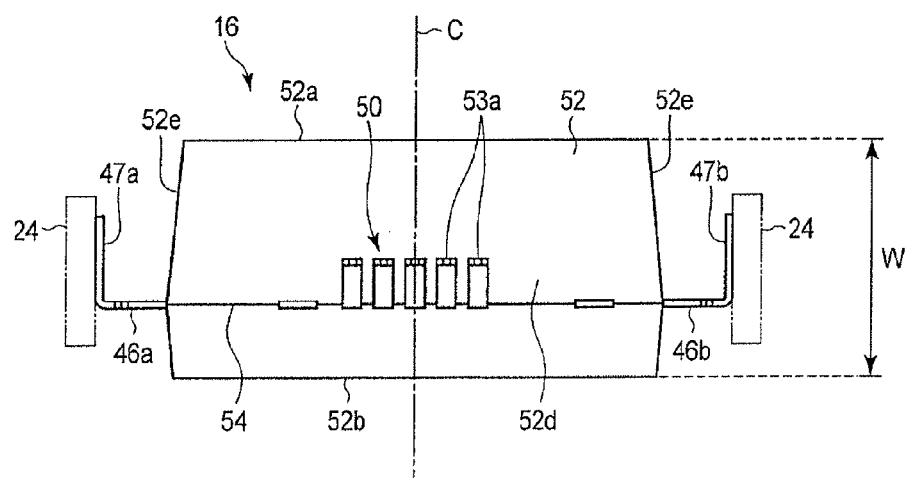
F I G. 11

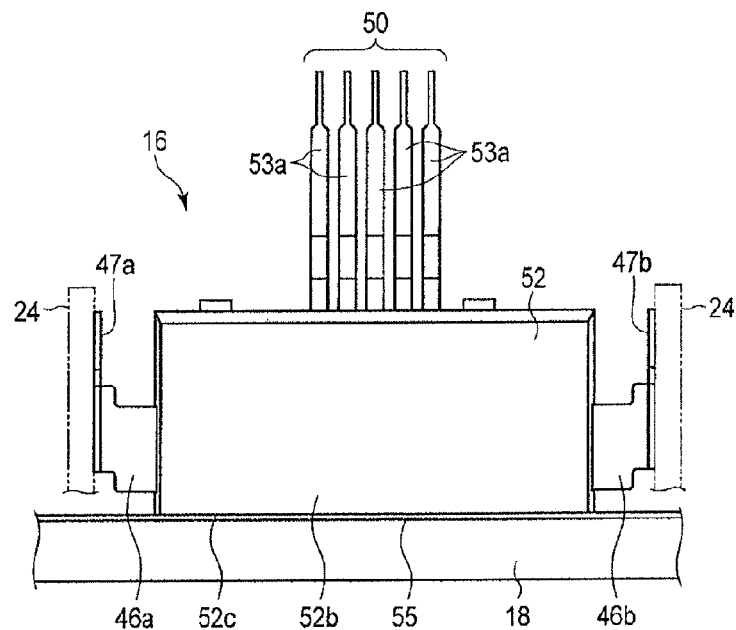
F I G. 12
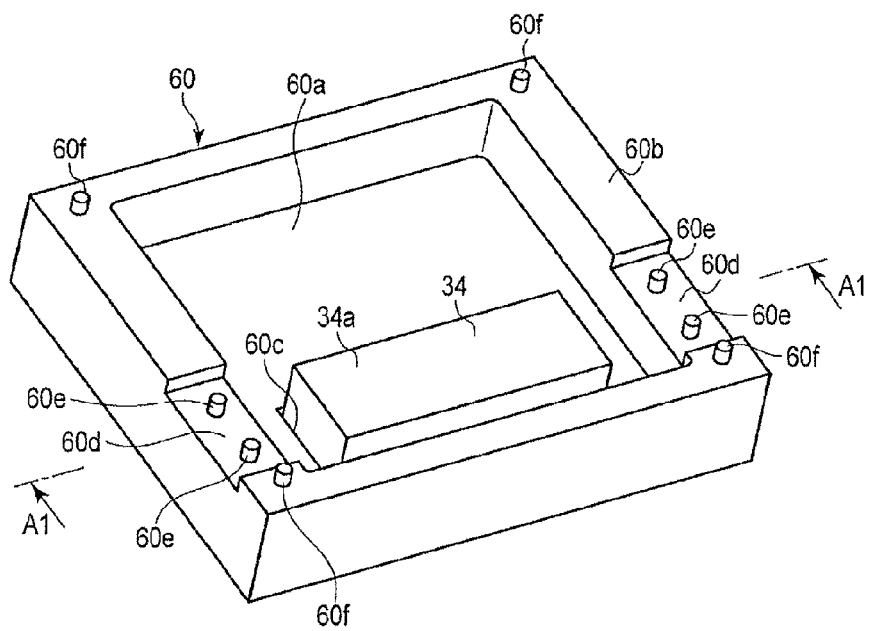
F I G. 13

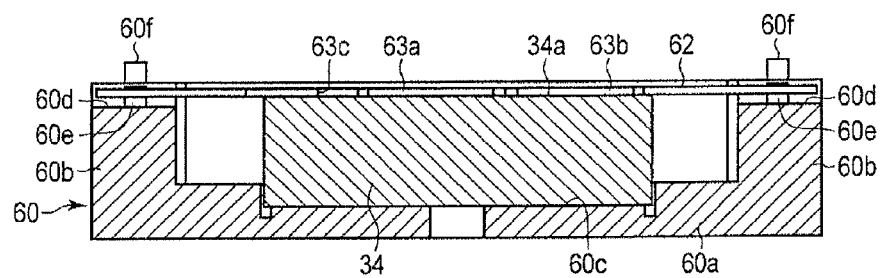
F I G. 16
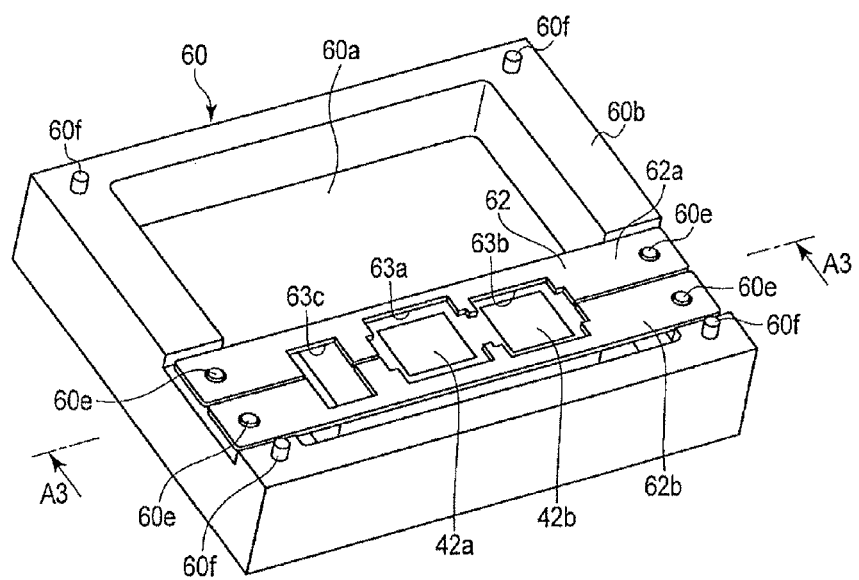
F I G. 17

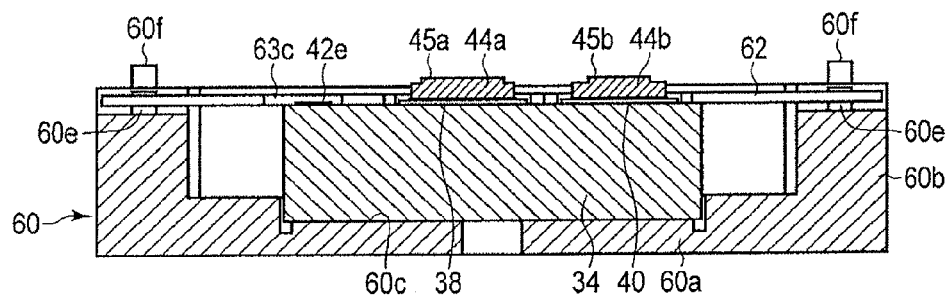
F I G. 24
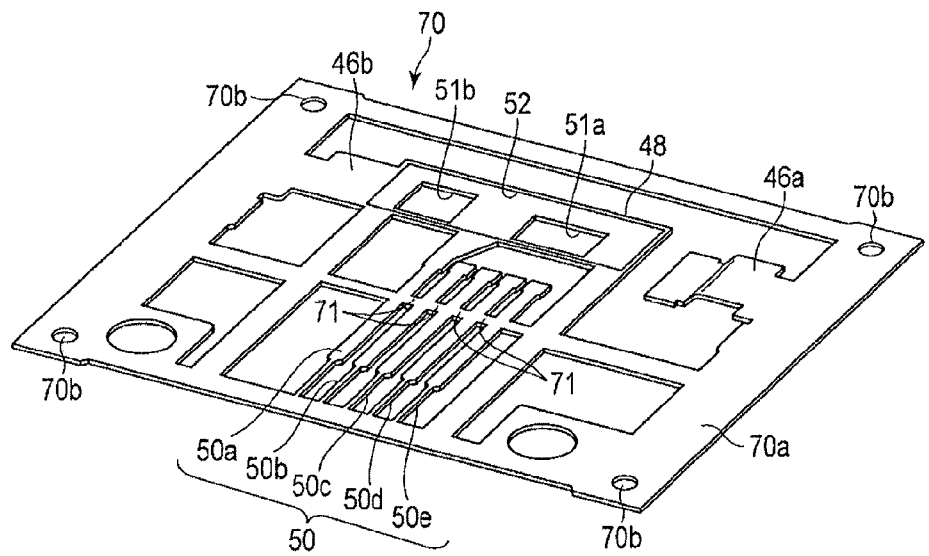
F I G. 25

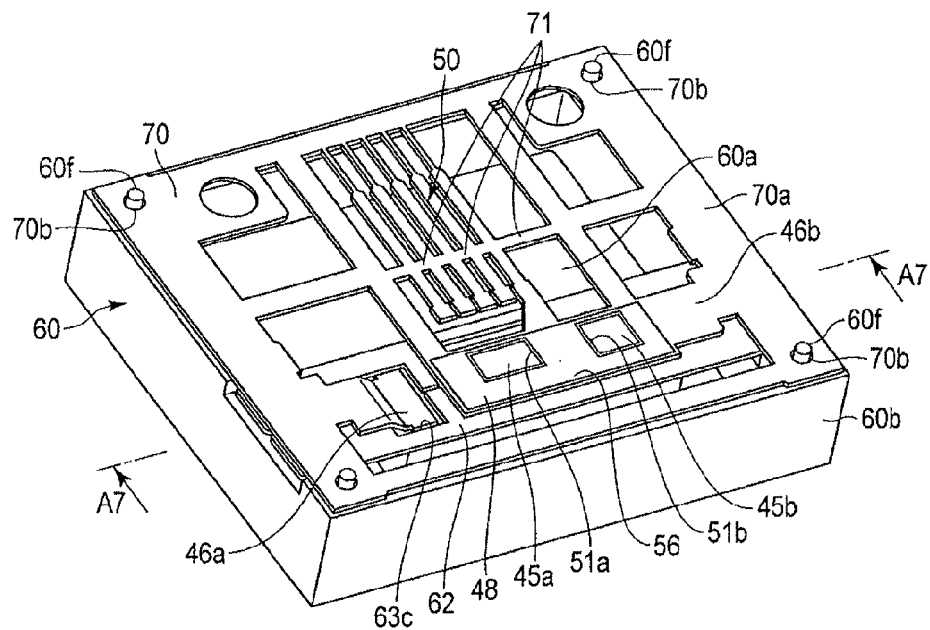
F I G. 26
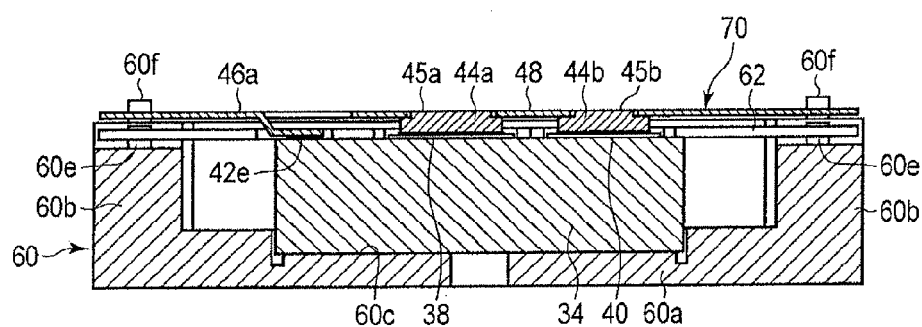
F I G. 27

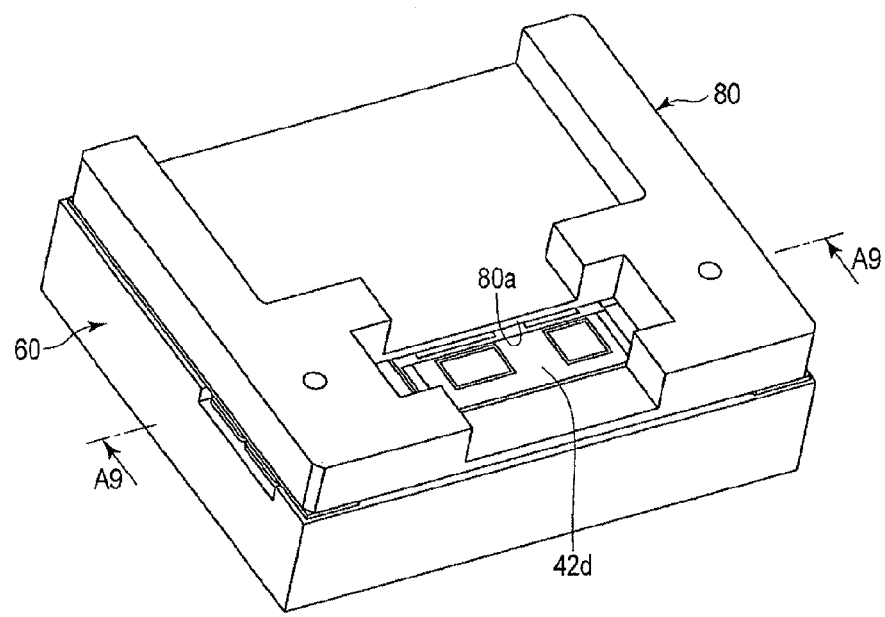
F I G. 30
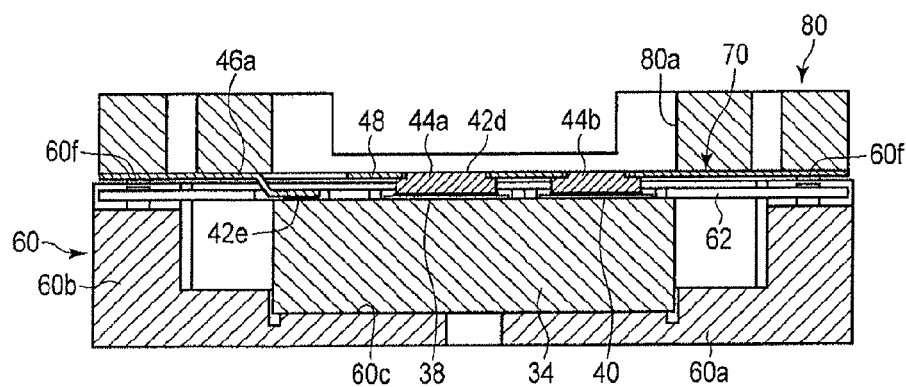
F I G. 31

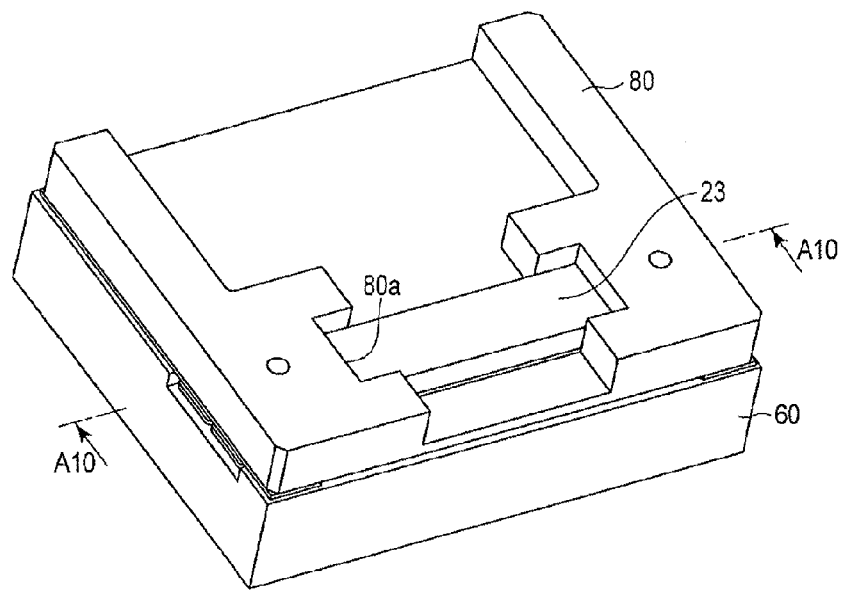
F I G. 32
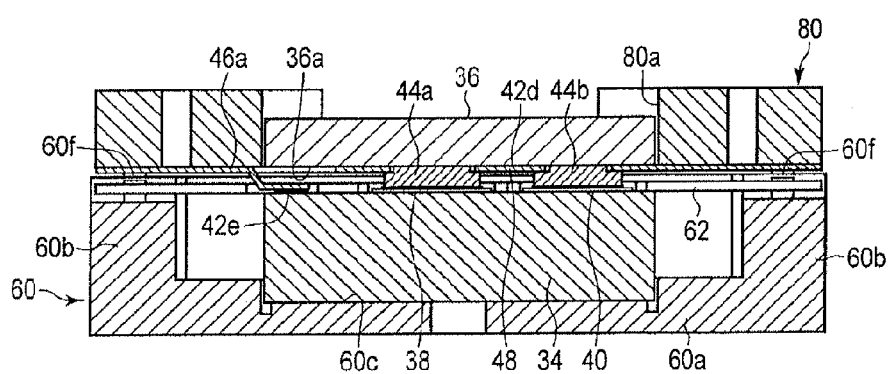
F I G. 33

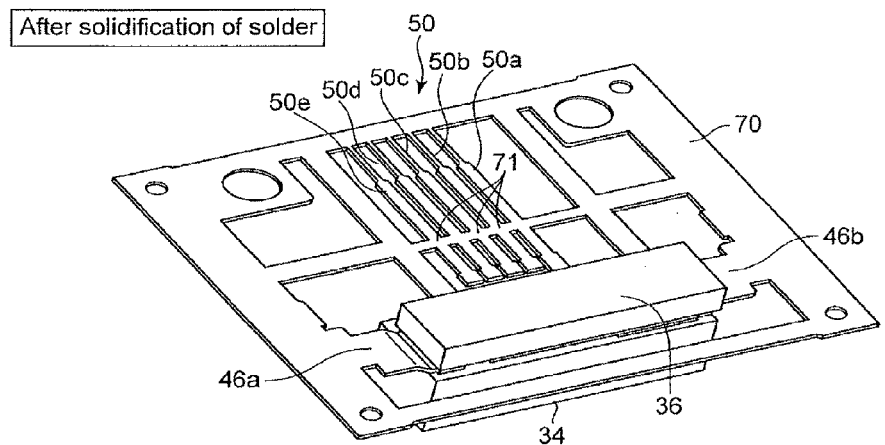
F I G. 36
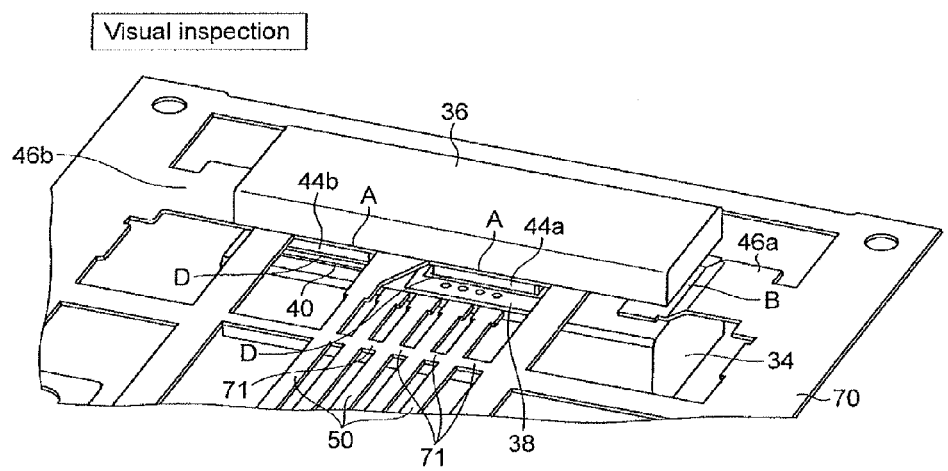
F I G. 37

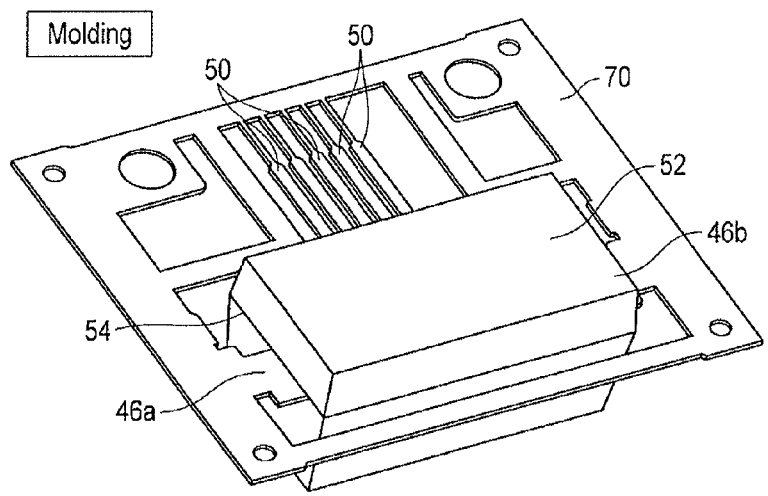
F I G. 40
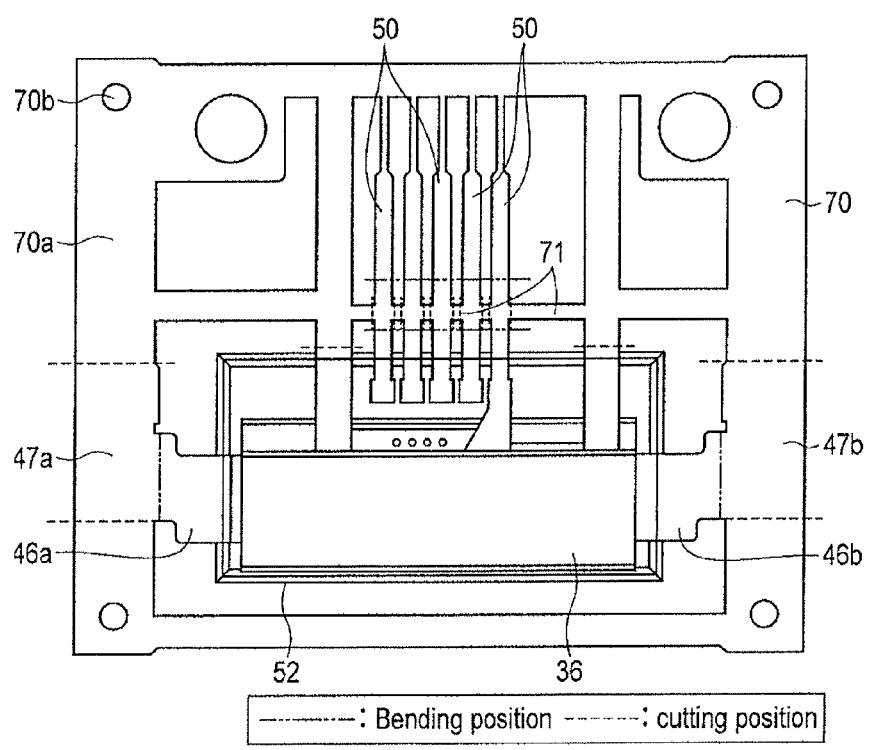
F I G. 41

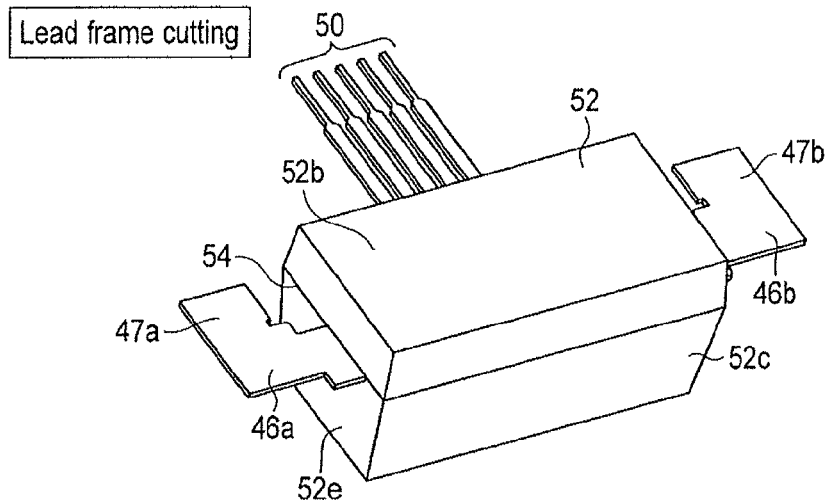
F I G. 42
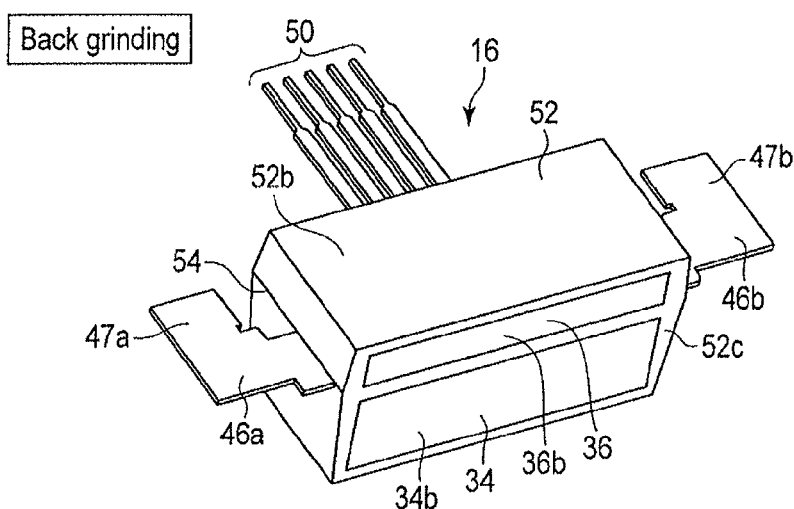
F I G. 43

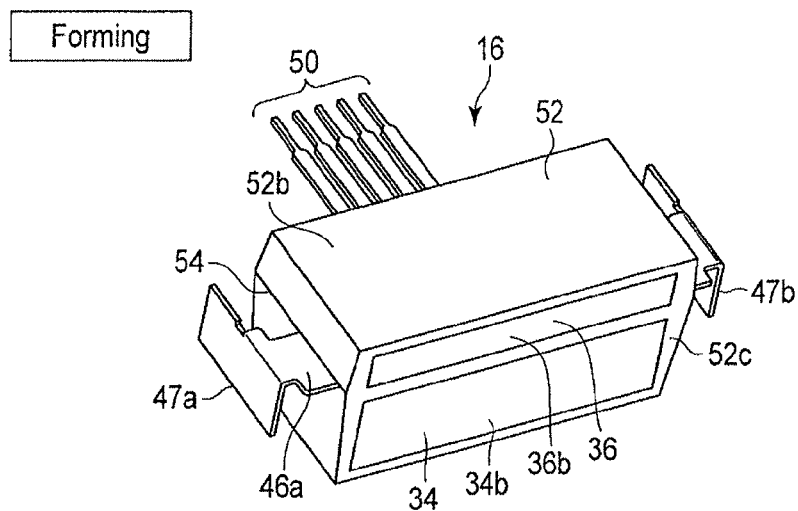
F I G. 44
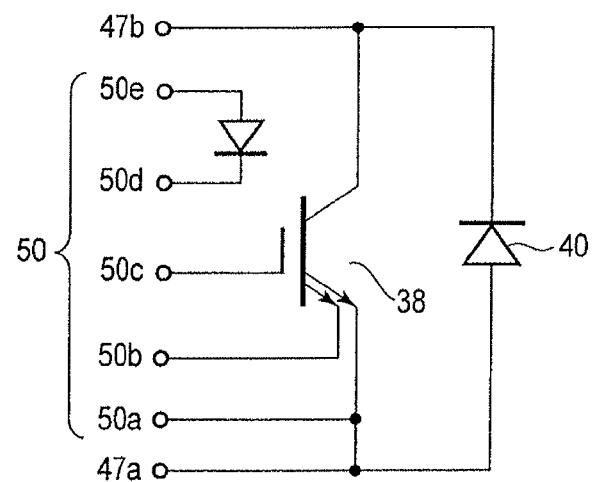
F I G. 45

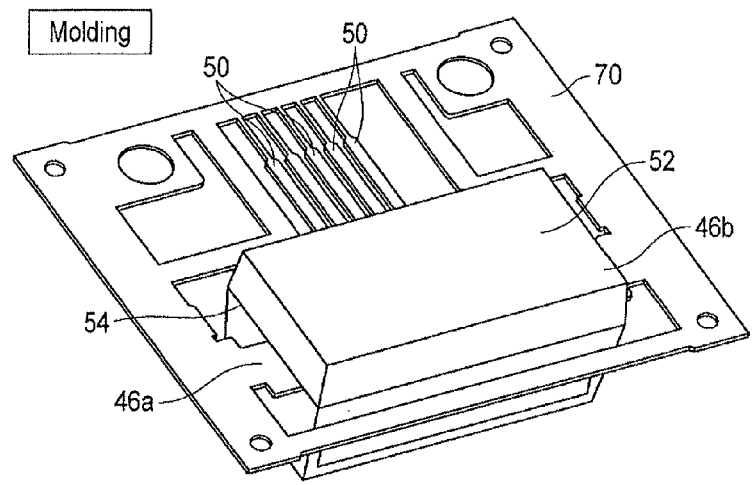
F I G. 46
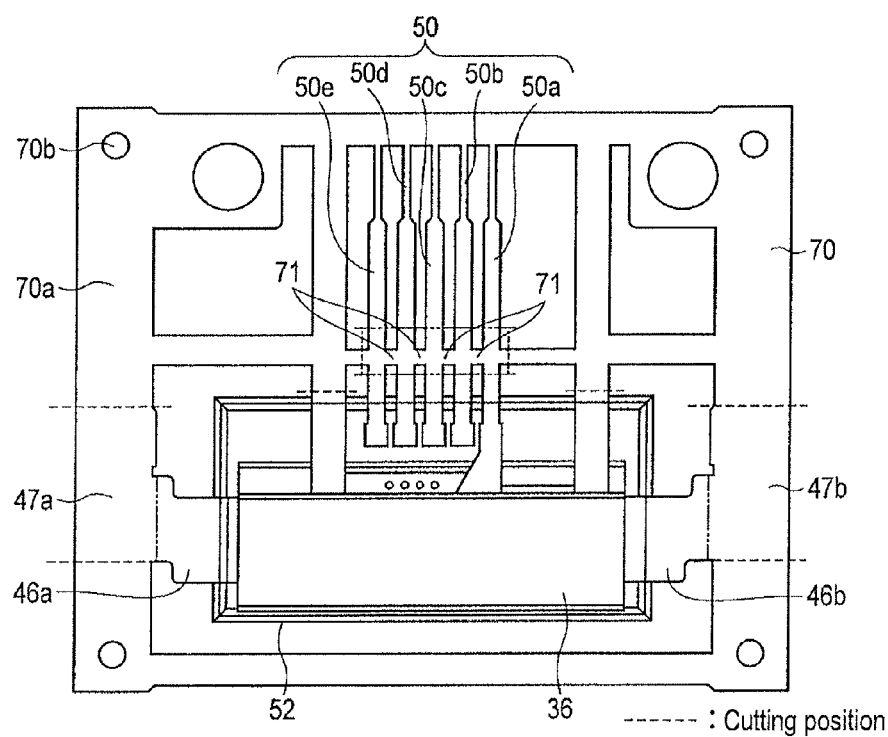
F I G. 47

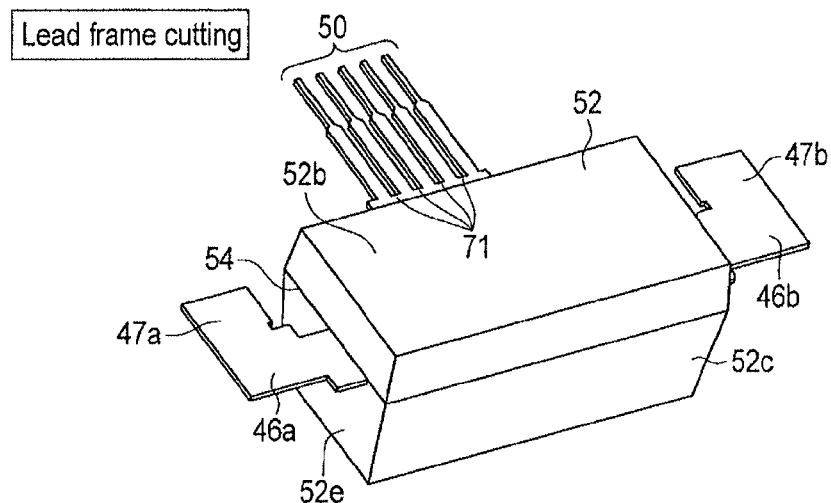
F I G. 48
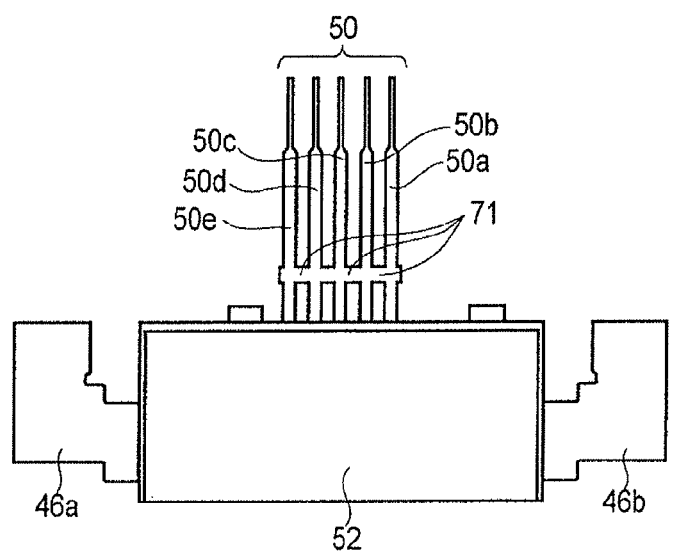
F I G. 49

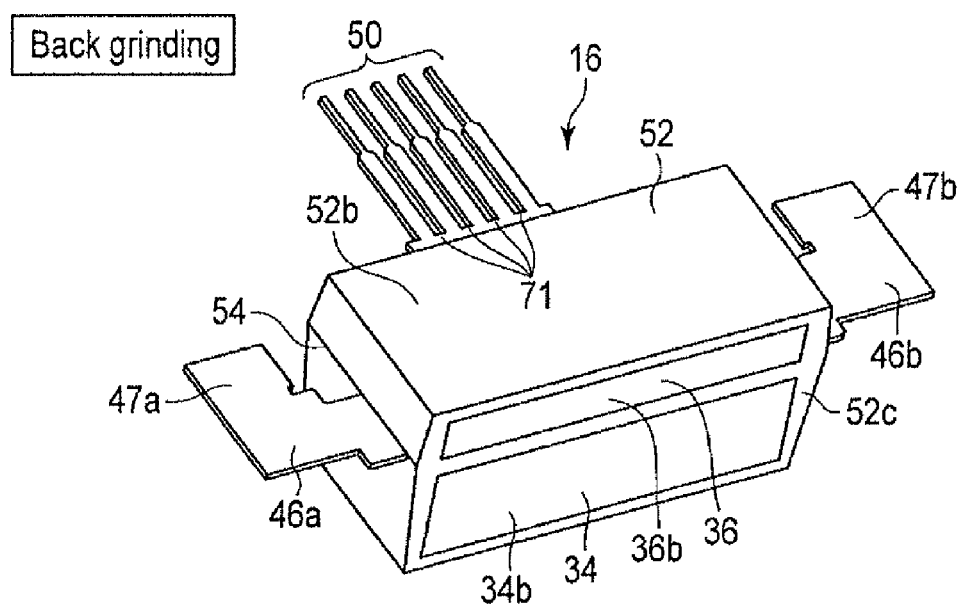
F I G. 50

SEMICONDUCTOR POWER CONVERTER AND METHOD OF MANUFACTURING THE SAME

CROSS-REFERENCE TO RELATED APPLICATIONS

This application is based upon and claims the benefit of priority from Japanese Patent Applications No. 2012-240990, filed Oct. 31, 2012; and No. 2013-137218, filed Jun. 28, 2013, the entire contents of all of which are incorporated herein by reference.

FIELD

Embodiments described herein relate generally to a semiconductor power converter and a method of manufacturing the same.

BACKGROUND

In recent years, hybrid vehicles that use an engine and a motor in combination have rapidly become widely used to achieve higher fuel efficiency. On the other hand, marketing of electric vehicles that can run by a motor alone is in progress. To be feasible, these vehicles require use of a power converter for AC/DC conversion between a battery and the motor.

In the hybrid and electric vehicles, the semiconductor power converter is expected to be small and highly reliable. To this end, the power converter requires high cooling efficiency. As a measure to achieve this, a power converter structure of the double-sided cooling type has been proposed in which electrical conductors are connected individually to the obverse and reverse surfaces of a semiconductor element and heat is released from the electrical conductors to a cooler.

In assembling a power converter of the double-sided cooling type, joining work is required in at least two positions to join the semiconductor element and the electrical conductors on its opposite surfaces. Further, there is a problem that the number of assembly man-hours increases if joining of power terminals and signal terminals is taken into account. If the joining positions increase, moreover, the number of man-hours for the inspection of joint soundness increases, and assembly errors are accumulated so that finished-product dimensional stability is reduced.

A mounter is assumed to be used to enhance mass-productivity. In this case, parts may become misaligned due to shaky transportation or flow of melted connecting bodies, possibly reducing the assembly yield.

BRIEF DESCRIPTION OF THE DRAWINGS

FIG. 10 is a side view showing the semiconductor module;

FIG. 11 is a plan view showing the semiconductor module;

FIG. 12 is a front view showing the semiconductor module;

FIG. 13 is a perspective view of a first fixing jig and first electrical conductor showing a process of manufacturing the semiconductor module;

FIG. 16 is a sectional view taken along line A2-A2 of FIG. 15;

FIG. 17 is a perspective view showing how first and second connecting bodies are placed in a process of manufacturing the semiconductor module;

FIG. 24 is a sectional view taken along line A6-A6 of FIG. 23;

FIG. 25 is a perspective view showing a lead frame used in the manufacturing processes;

FIG. 26 is a perspective view showing how the lead frame is placed on the first fixing jig and first and second convex electrical conductors in a process of manufacturing the semiconductor module;

FIG. 27 is a sectional view taken along line A7-A7 of FIG. 26;

FIG. 30 is a perspective view showing how a second fixing jig is placed on the first fixing jig and lead frame in a process of manufacturing the semiconductor module;

FIG. 31 is a sectional view taken along line A9-A9 of FIG. 30;

FIG. 32 is a perspective view showing how a second electrical conductor is placed on the second fixing jig in a process of manufacturing the semiconductor module;

FIG. 33 is a sectional view taken along line A10-A10 of FIG. 32;

FIG. 36 is a perspective view showing a state in which constituent members are joined together with solder and the first and second fixing jigs and split jig are removed, in a process of manufacturing the semiconductor module;

FIG. 37 is a perspective view showing a visual inspection process in a process of manufacturing the semiconductor module;

FIG. 40 is a perspective view showing a resin molding process in a process of manufacturing the semiconductor module;

FIG. 41 is a plan view of the semiconductor module showing cutting positions and bending positions of the lead frame in a process of manufacturing the semiconductor module;

FIG. 42 is a perspective view showing a lead frame cutting process in a process of manufacturing the semiconductor module;

FIG. 43 is a perspective view showing a process of grinding the bottom of a molded resin body in a process of manufacturing the semiconductor module;

FIG. 44 is a perspective view showing a process of bend-forming first and second power terminals and signal terminals in a process of manufacturing the semiconductor module;

FIG. 45 is a diagram showing an equivalent circuit of the semiconductor module;

FIG. 46 is a perspective view showing a resin molding process in a process of manufacturing a semiconductor module according to a second embodiment;

FIG. 47 is a plan view of the semiconductor module of the second embodiment showing cutting positions and bending positions of a lead frame in a process of manufacturing the semiconductor module;

FIG. 48 is a perspective view showing a lead frame cutting process in a process of manufacturing the semiconductor module of the second embodiment;

FIG. 49 is a side view showing the semiconductor module of the second embodiment with the lead frame cut in a process of manufacturing the semiconductor module; and FIG. 50 is a perspective view showing a process of grinding the bottom of a molded resin body in a process of manufacturing the semiconductor module of the second embodiment.

DETAILED DESCRIPTION

Figure 1:
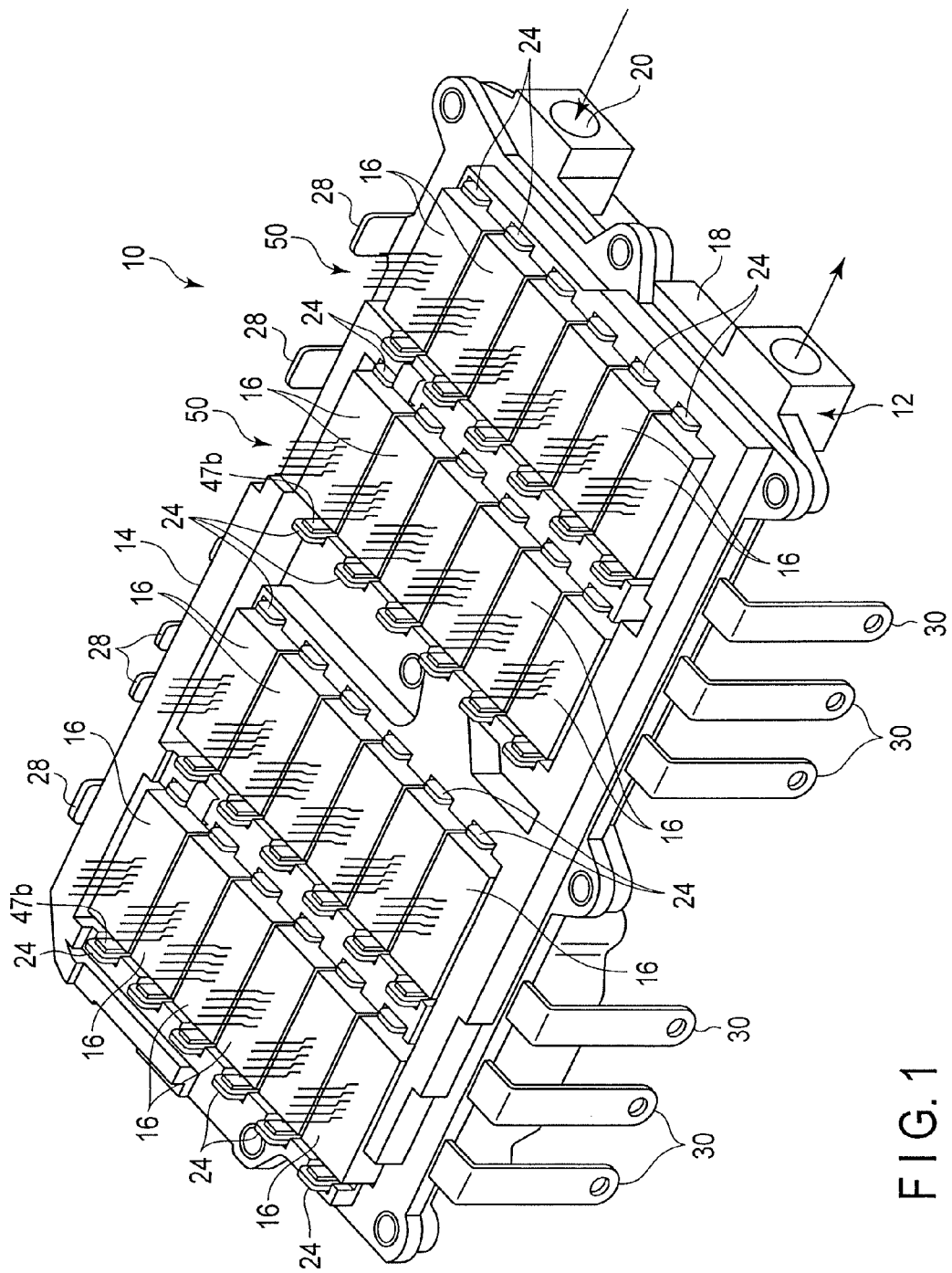
FIG. 1 is a perspective view showing a semiconductor power converter according to a first embodiment with its circuit board removed.

Various embodiments will be described hereinafter with reference to the accompanying drawings. In general, according to one embodiment, a semiconductor power converter comprises: a first electrical conductor comprising a first joint surface and a first bottom surface perpendicular to the first joint surface; a second electrical conductor comprising a second joint surface opposed parallel to the first joint surface and a second bottom surface located perpendicular to the second joint surface and flush with the first bottom surface; a plate-shaped first semiconductor element comprising different electrodes on the obverse and reverse surfaces thereof, one of the electrodes being joined to the first joint surface of the first electrical conductor by a first connecting body and disposed parallel to the first joint surface; a plate-shaped second semiconductor element comprising different electrodes on the obverse and reverse surfaces thereof, one of the electrodes being joined to the first joint surface of the first electrical conductor by a second connecting body and disposed parallel to the first joint surface; a first convex electrical conductor joined to the other electrode of the first semiconductor element by a third connecting body and comprising a projection projecting toward the second joint surface; a second convex electrical conductor joined to the other electrode of the second semiconductor element by a fourth connecting body and comprising a projection projecting toward the second joint surface; a junction formed of an electrically conductive metal plate and comprising a first positioning opening in which the projection of the first convex electrical conductor is fitted and a second positioning opening in which the projection of the second convex electrical conductor is fitted and joined to the first and second convex electrical conductors and the second joint surface of the second electrical conductor by a sixth connecting body; a first power terminal comprising a proximal end portion joined to the first joint surface by a fifth connecting body and extending outwardly from the first electrical conductor; a second power terminal extending outwardly relative to the second electrical conductor from the junction; signal terminals connected to the first semiconductor element; and an envelope which covers and seals the proximal end portion of the first power terminal, a proximal end portion of the second power terminal, a proximal end portion of the signal terminal, and the other constituent members. The envelope comprises a flat bottom surface which extends perpendicular to the first and second semiconductor elements and in which the first bottom surface of the first electrical conductor and the second bottom surface of the second electrical conductor are exposed.

The drawings are schematic views for a better understanding of the embodiments, and the shapes, sizes, proportions, etc., shown therein may be different from actual specifications. However, they may be suitably designed and modified in consideration of the following description and known techniques.

First Embodiment

Figure 2:
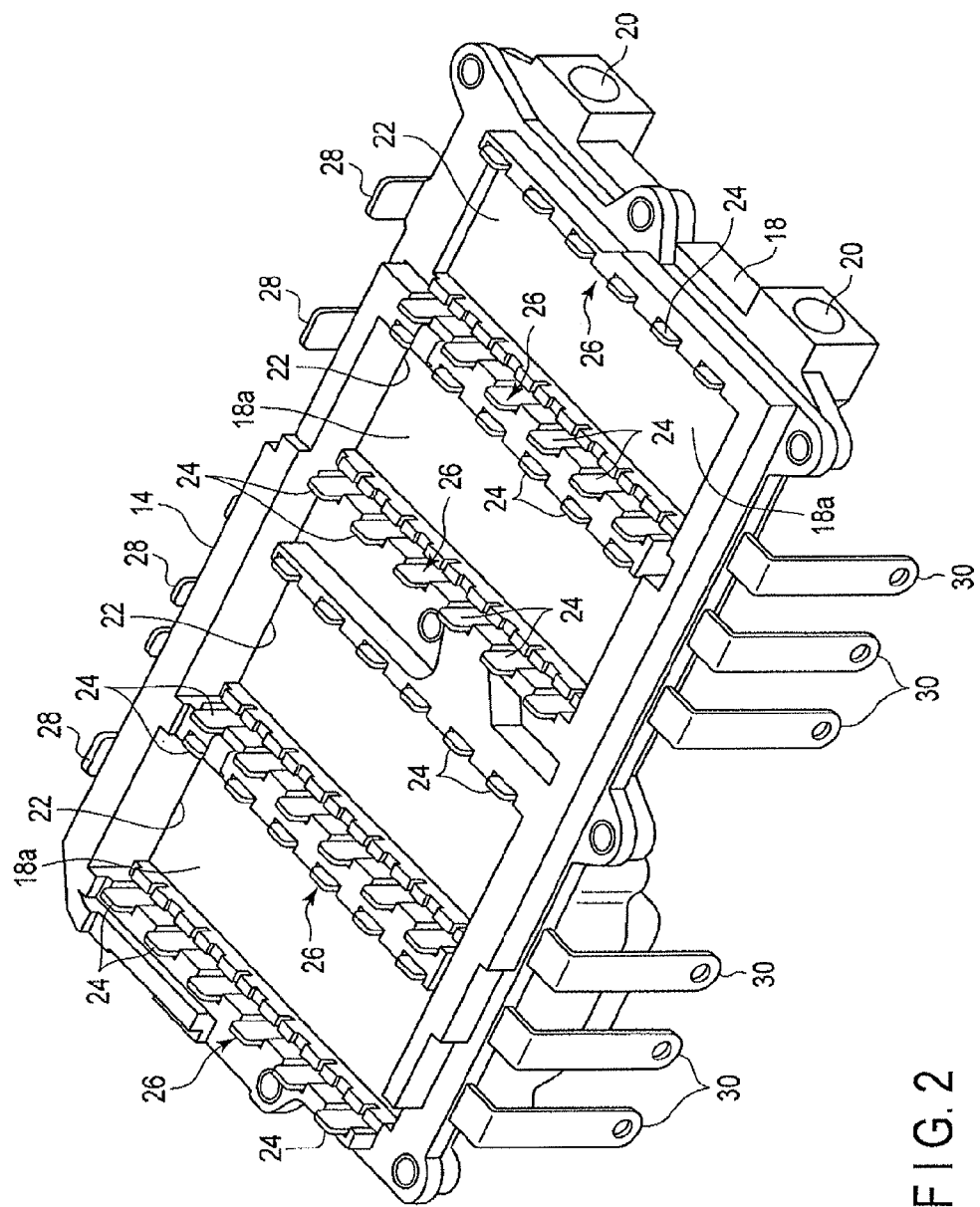
FIG. 2 is a perspective view showing a support frame and cooler of the semiconductor power converter.

FIG. 1 is a perspective view showing a semiconductor power converter according to a first embodiment with its control circuit board removed. FIG. 2 is a perspective view showing a support frame and cooler of the semiconductor power converter, and FIG. 3 is a perspective view showing the entire semiconductor power converter including the control circuit board.

Figure 3:
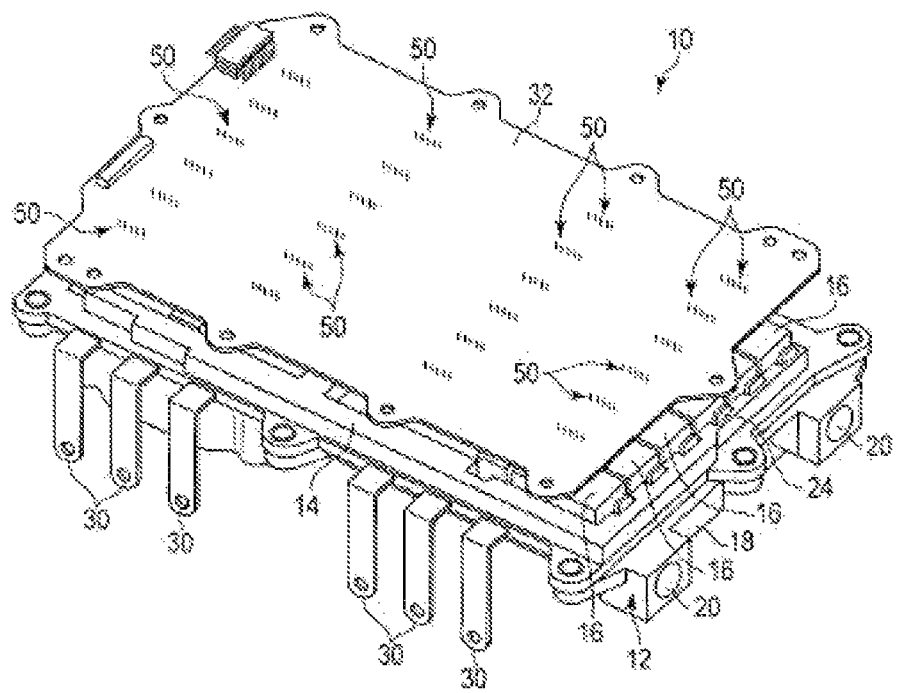
FIG. 3 is a perspective view showing the entire semiconductor power converter including the control circuit board.

As shown in FIGS. 1 to 3, a semiconductor power converter 10 comprises a cooler 12, support frame 14, and a plurality of semiconductor modules 16. The support frame 14 is secured on the cooler 12. The semiconductor modules 16 are set on the cooler and supported by the support frame. The cooler 12 comprises a flat cuboid cooling block 18 with a flat rectangular heat receiving surface 18a. The cooling block 18 is made of, for example, aluminum. Further, a refrigerant passage 20 through which a cooling medium, such as water, is passed is formed in the cooling block 18.

The support frame 14 integrally comprises a rectangular outer frame of a size corresponding to the heat receiving surface 18a and a plurality of coupling beams extending parallel to one another inside the outer frame. The outer frame and coupling beams define rectangular installation space portions 22 arranged in, for example, four rows. Further, the support frame 14 comprises bus bars 26, input terminals 28, and two sets of three-phase output terminals 30. Each bus bar 26 comprises a plurality of connecting terminals 24 electrically connected to the semiconductor modules 16, which will be described later. The connecting terminals 24 of the bus bars 26 are arranged at intervals along each side edge of each installation space portion 22. The support frame 14 is formed integrally with the terminals by, for example, insert-molding a resin. Furthermore, the support frame 14 is secured on the heat receiving surface 18a of the cooling block 18 by, for example, screws.

As shown in FIG. 1, the semiconductor modules 16 are located, for example, in four rows each comprising six modules, on the support frame 14. In each row, the six semiconductor modules 16 are disposed in their corresponding installation space portion 22 of the support frame 14, and the bottom surface of each semiconductor module is located on the heat receiving surface 18a of the cooler 12 with an insulating sheet (not shown) therebetween. Respective power terminals of the semiconductor modules 16 contact their corresponding connecting terminals 24 of the bus bars 26 and are electrically connected to the bus bars 26. Further, a plurality of signal terminals 50 of each semiconductor module 16 project upwardly.

As shown in FIG. 3, the semiconductor power converter 10 comprises a control circuit board 32, which controls the input/output and other operations of the semiconductor modules 16 and the entire device. The control circuit board 32 is in the form of a rectangular structure substantially as large as the support frame 14. The control circuit board 32 is superposed on the semiconductor modules 16 and attached to the support frame 14 by fixing screws (not shown) or the like. The signal terminals 50 of the semiconductor modules 16 are electrically connected to the control circuit board 32.

The following is a detailed description of one of the semiconductor modules 16 that constitute the semiconductor power converter.

Figure 4:
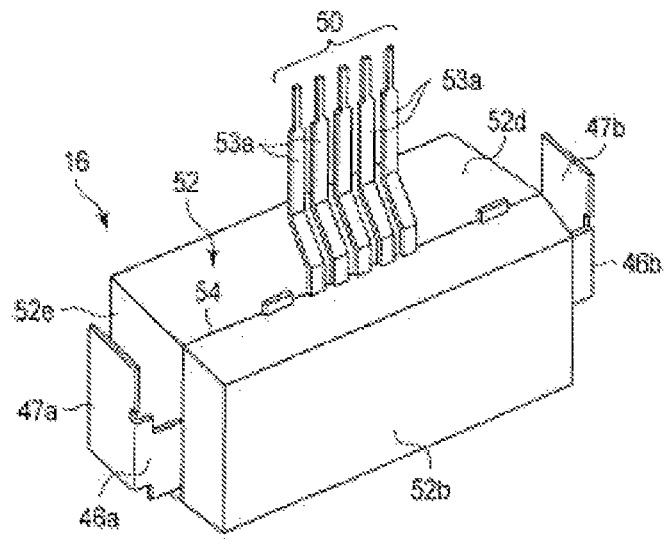
FIG. 4 is a perspective view showing a semiconductor module of the semiconductor power converter.
Figure 5:
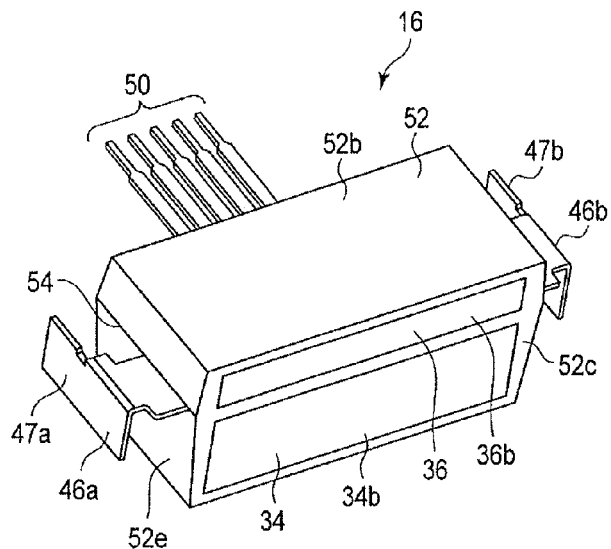
FIG. 5 is a perspective view of the semiconductor module taken in a different direction.
Figure 6:
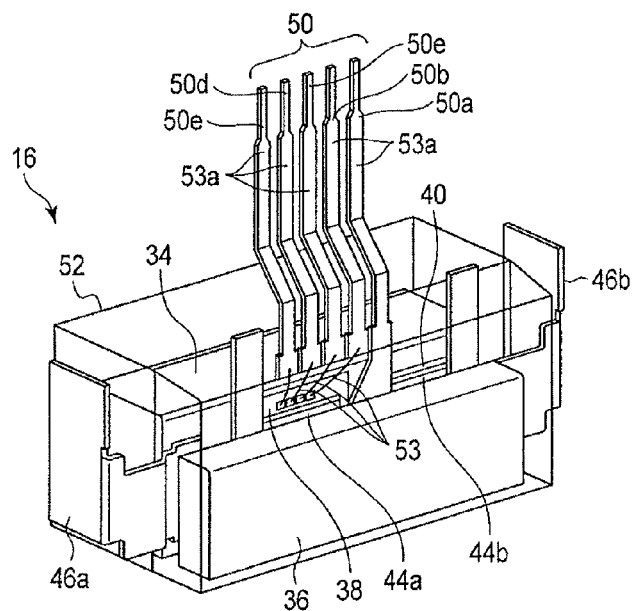
FIG. 6 is a perspective view showing the internal structure of the semiconductor module seen through a mold.
Figure 7:
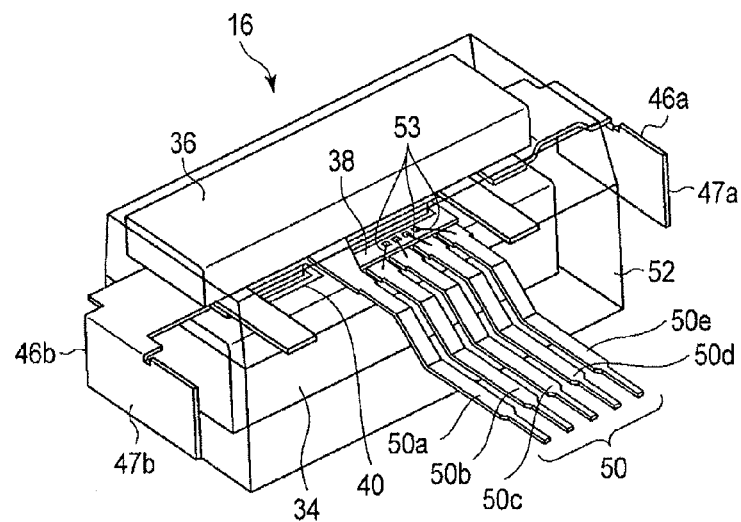
FIG. 7 is a perspective view showing the internal structure of the semiconductor module seen through the mold.
Figure 8:
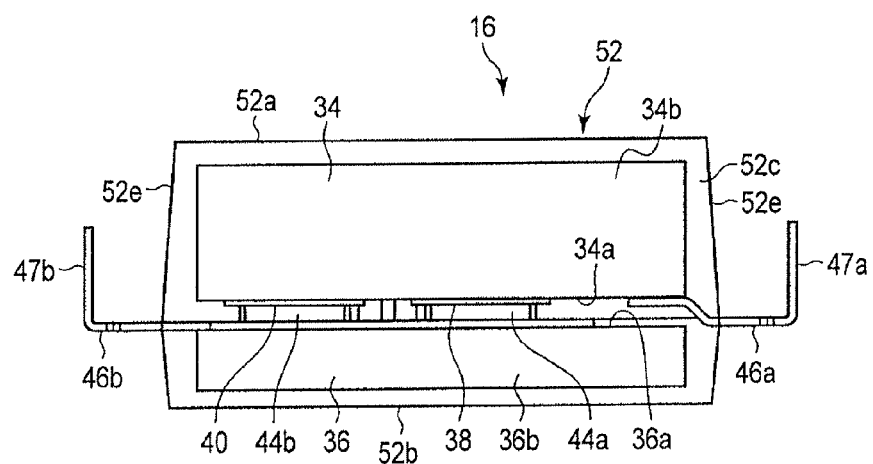
FIG. 8 is a plan view showing the internal structure of the semiconductor module seen through the mold.
Figure 9:
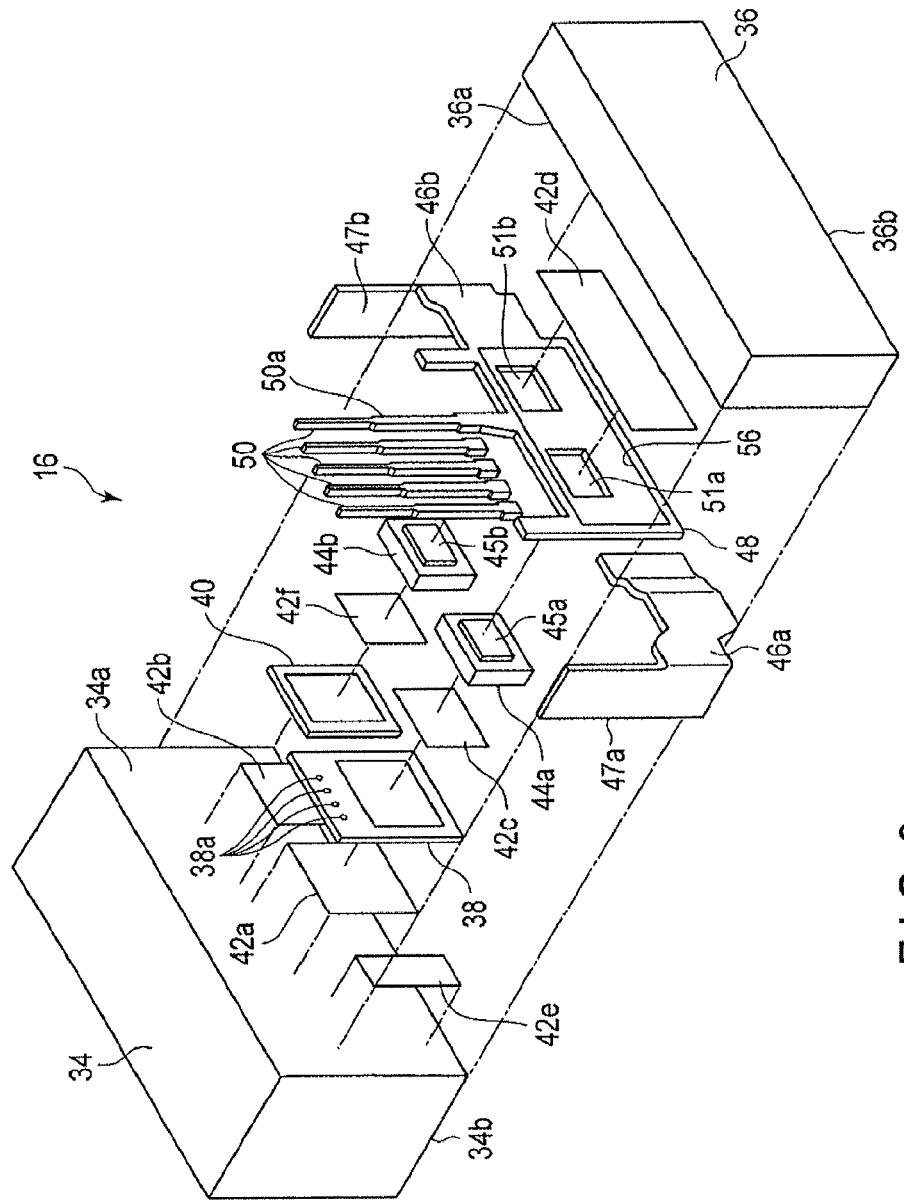
FIG. 9 is an exploded perspective view showing constituent parts of the semiconductor module.

FIGS. 4 and 5 are perspective views showing the semiconductor module, FIGS. 6, 7 and 8 are perspective views and a plan view showing the internal structure of the semiconductor module seen through a molded resin body, and FIG. 9 is an exploded perspective view showing constituent parts of the semiconductor module. FIGS. 10, 11 and 12 are side, plan, and front views, respectively, of the semiconductor module.

As shown in FIGS. 4 to 9, the semiconductor module 16 is constructed as a power converter of the so-called double-sided cooling and vertical-mounting type. Specifically, the semiconductor module 16 comprises block-shaped first and second electrical conductors (collector and emitter) 34 and 36 of, for example, copper and first and second semiconductor elements 38 and 40 interposed between and joined to the first and second electrical conductors.

One principal surface (lateral surface) of the first electrical conductor 34 constitutes a rectangular joint surface (first joint surface) 34a, and a bottom surface 34b perpendicular to this joint surface constitutes a radiating surface. The second electrical conductor 36 is substantially as long as the first electrical conductor 34 and its thickness (width) is smaller than (for example, about a third of) that of the first electrical conductor 34. Further, the second electrical conductor 36 is less tall than the first electrical conductor 34. One principal surface (lateral surface) of the second electrical conductor 36 constitutes a rectangular joint surface (second joint surface) 36a, and moreover, a bottom surface 36b perpendicular to this joint surface constitutes a radiating surface. Joint surface 36a of the second electrical conductor 36 is opposed parallel to joint surface 34a of the first electrical conductor 34. Bottom surface 36b is located flush with bottom surface 34b of the first electrical conductor 34.

The first semiconductor element 38 is a power semiconductor element, for example, an insulator gate bipolar transistor (IGBT), while the second semiconductor element 40 is a diode. The first semiconductor element 38 is a rectangular plate formed with different electrodes on its obverse and reverse surfaces. Further, a plurality (for example, four) of connecting terminals 38a are formed on one surface of the first semiconductor element 38. The entire surfaces of the first semiconductor element 38 except areas for the electrodes and connecting terminals are covered by an insulating film of, for example, polyimide.

The second semiconductor element 40 is a rectangular plate formed with different electrodes on its obverse and reverse surfaces. The entire surfaces of the second semiconductor element 40 except rectangular areas for the electrodes are covered by an insulating film of, for example, polyimide.

The first semiconductor element 38 is disposed parallel to joint surface 34a of the first electrical conductor 34, and its one electrode (collector) is joined to joint surface 34a of the first electrical conductor 34 with a first connecting body, for example, a rectangular solder sheet 42a, therebetween. The second semiconductor element 40 is disposed parallel to joint surface 34a of the first electrical conductor 34 and side by side with the first semiconductor element 38 with a gap therebetween in the longitudinal direction of the first electrical conductor 34. One electrode of the second semiconductor element 40 is joined to joint surface 34a of the first electrical conductor 34 with a second connecting body, for example, a rectangular solder sheet 42b, therebetween.

Thus, the first and second semiconductor elements 38 and 40 are disposed parallel to joint surface 34a of the first electrical conductor 34 and perpendicular to bottom surface 34b of the first electrical conductor.

Further, a fifth connecting body, for example, a rectangular solder sheet 42e, is provided on joint surface 34a of the first electrical conductor 34 and located beside the first semiconductor element 38.

A first convex electrical conductor 44a for positioning is joined to the other electrode of the first semiconductor element 38 with a third connecting body, for example, a rectangular solder sheet 42c, therebetween. The first convex electrical conductor 44a is made of, for example, copper and integrally comprises a flat cuboid main body and a flat cuboid projection 45a smaller than the main body and projecting from one principal surface of the main body. The flat principal surface side of the main body of the first convex electrical conductor 44a is joined electrically and mechanically to the electrode of the first semiconductor element 38 by solder sheet 42c.

A second convex electrical conductor 44b for positioning is joined to the other electrode of the second semiconductor element 40 with a fourth connecting body, for example, a rectangular solder sheet 42f, therebetween. The second convex electrical conductor 44b is made of, for example, copper and integrally comprises a flat cuboid main body and a flat cuboid projection 45b smaller than the main body and projecting from the one principal surface of the main body. The flat principal surface side of the main body of the second convex electrical conductor 44b is joined electrically and mechanically to the electrode of the second semiconductor element 40 by solder sheet 42f.

The first and second convex electrical conductors 44a and 44b need not always be separate parts, and their main bodies may be integrally formed so that the two projections can be provided on a common main body.

As shown in FIGS. 4 to 9, each semiconductor module 16 comprises first and second power terminals 46a and 46b, which are each formed of a lead frame or electrically conductive metal plate (described later), junction (emitter plate) 48 continuous with the second power terminal, and a plurality (for example, five) of signal terminals 50.

The first power terminal 46a is an independent structure, the proximal end portion of which is joined to joint surface 34a of the first electrical conductor 34 by solder sheet 42e. The first power terminal 46a projects outwardly relative to the module from one longitudinal end of the first electrical conductor 34, and its contact portion 47a is bent at right angles toward the first electrical conductor 34 and opposed substantially parallel to one end surface of the module.

The proximal end portion of the second power terminal 46b is connected to the junction (emitter plate) 48. Further, the second power terminal 46b projects outwardly relative to the module from the other longitudinal end of the first electrical conductor 34, and its contact portion 47b is bent at right angles toward the first electrical conductor 34 and opposed substantially parallel to the other end surface of the module.

The junction (emitter plate) 48 is an elongated rectangular plate. First and second openings 51a and 51b for positioning are formed side by side in the junction 48. The first opening 51a has such a size that projection 45a of the first convex electrical conductor 44a can be fitted therein and is smaller than the main body of the conductor 44a. Likewise, the second opening 51b has such a size that projection 45b of the second convex electrical conductor 44b can be fitted therein and is smaller than the main body of the conductor 44b. The surface of the junction 48 on the side of the second electrical conductor 36 is formed with a shallow rectangular recess 56, which covers an area including the first and second openings 51a and 51b. Further, the junction 48 integrally comprises three supporting projections projecting upwardly from its upper edge. One of the signal terminals 50 extends upwardly from the central supporting projection. Specifically, an emitter branch 50a, one of the five signal terminals 50, diverges from the junction (emitter plate) 48 and is located substantially parallel to the other signal terminals 50.

The junction 48 and second power terminal 46b are joined to the first and second convex electrical conductors 44a and 44b with projections 45a and 45b of the conductors 44a and 44b in engagement with the first and second openings 51a and 51b, respectively.

Further, the junction 48 and projections 45a and 45b of the first and second convex electrical conductors 44a and 44b are joined electrically and mechanically to joint surface 36a of the second electrical conductor 36 by a sixth connecting body, for example, a rectangular solder sheet 42d, in the recess 56 of the junction 48. Thus, the junction 48, first and second convex electrical conductors 44a and 44b, and second electrical conductor 36 are joined to one another by solder sheet 42d.

In this way, the electrodes of the first and second semiconductor elements 38 and 40 are electrically joined to the second electrical conductor 36 through the first and second convex electrical conductors 44a and 44b. The semiconductor elements 38 and 40 are interposed between the first and second electrical conductors 34 and 36 and disposed parallel to joint surfaces 34a and 36a and perpendicular to bottom surfaces 34b and 36b of the conductors 34 and 36.

The signal terminals 50 project upwardly from the module and extend parallel to joint surface 34a of the first electrical conductor 34. The respective proximal ends of the remaining four signal terminals 50 are connected to the connecting terminals 38a of the first semiconductor element 38 by bonding wires 53, individually. FIG. 45 shows an equivalent circuit of the semiconductor module 16. As shown in FIGS. 6, 7 and 45, the signal terminals 50 comprise the emitter branch (collector-emitter voltage monitor terminal or branch signal terminal) 50a, a current (emitter sense current) monitor terminal 50b, a gate (gate-emitter voltage) terminal 50c, and chip temperature monitor terminals 50d and 50e. The emitter branch 50a diverges from or conducts to the junction (emitter plate) 48. The respective proximal ends of the signal terminals 50b to 50e and their corresponding connecting terminals 38a of the first semiconductor element 38 are connected to one another by the bonding wires (lead wires) 53. The first semiconductor element 38 is connected to the first and second power terminals 46a and 46b through the first and second electrical conductors 34 and 36, respectively. Likewise, the second semiconductor element 40 is connected to the power terminals 46a and 46b through the electrical conductors 34 and 36, respectively.

As shown in FIGS. 4 to 8 and FIGS. 10 to 12, each semiconductor module 16 comprises an envelope, for example, a molded resin body (insulator) 52, which covers and seals the constituent members described above. The molded resin body 52 is a substantially rectangular block structure comprising two parallel lateral surfaces 52a and 52b, flat bottom surface 52c, top surface 52d, and two end surfaces 52e. Lateral surfaces 52a and 52b are located parallel to joint surfaces 34a and 36a of the first and second electrical conductors 34 and 36. Bottom surface 52c extends perpendicular to lateral surfaces 52a and 52b. The top surface 52d is opposed to bottom surface 52c. The end surfaces 52e are located individually at the longitudinally opposite ends of the molded resin body 52. Bottom surface 52c is ground flat, and the respective bottom surfaces 34b and 36b of the first and second electrical conductors 34 and 36 are exposed in bottom surface 52c and located flush with bottom surface 52c.

The molded resin body 52 has a parting line 54 formed during forming-die cutting. This parting line 54 is located within a plane containing the junction 48 of the lead frame and the first and second power terminals 46a and 46b and remains along the top surface 52d and opposite end surfaces 52e of the molded resin body 52. Further, the parting line 54 is offset from the center of the molded resin body 52 in a thickness direction W (FIG. 11) toward lateral surface 52b.

That part of the top surface 52d of the molded resin body 52 which is located between the parting line 54 and lateral surface 52a is slightly inclined toward bottom surface 52c as it extends from the parting line 54 toward lateral surface 52a. That part between the parting line 54 and lateral surface 52b is slightly inclined toward bottom surface 52c as it extends from the parting line 54 toward lateral surface 52b.

That part of each end surface 52e of the molded resin body 52 which is located between the parting line 54 and lateral surface 52a is slightly inclined toward the other end surface as it extends from the parting line 54 toward lateral surface 52a. That part between the parting line 54 and lateral surface 52b is slightly inclined toward the other end surface as it extends from the parting line 54 toward lateral surface 52b.

As shown in FIGS. 4 to 8 and FIGS. 10 to 12, the first power terminal 46a projects longitudinally outwardly relative to the molded resin body 52 from its one end surface 52e in the position of the parting line 54. Further, contact portion 47a of the first power terminal is bent at right angles toward lateral surface 52a and spacedly opposed to the end surface 52e of the molded resin body 52. As contact portion 47a is bent, moreover, it is located in the center of the molded resin body 52 in the thickness direction W thereof.

The second power terminal 46b projects longitudinally outwardly relative to the molded resin body 52 from its other end surface 52e in the position of the parting line 54. Further, contact portion 47b of the second power terminal is bent at right angles toward lateral surface 52a and spacedly opposed to the end surface 52e of the molded resin body 52. As contact portion 47b is bent, moreover, it is located in the center of the molded resin body 52 in the thickness direction W thereof.

Each of the five signal terminals 50 is in the form of an elongated rod projecting upwardly from the top surface 52d of the molded resin body 52 in the position of the parting line 54. The five signal terminals 50 extend parallel to one another. Each signal terminal 50 is bent at two longitudinally spaced points, and its extending end portion 53a is located in the center of the molded resin body 52 in the thickness direction W. As shown in FIG. 11, moreover, the five signal terminals 50 and first and second power terminals 46a and 46b are disposed bilaterally symmetrically with respect to a center line C that is located in the longitudinal center of the molded resin body 52. An electrically conductive film (not shown) is formed on at least the outer surface of the end portion 53a of each signal terminal 50.

As shown in FIGS. 1, 10 and 12, the semiconductor modules 16 constructed in this manner are disposed in the installation space portion 22 of the support frame 14 so that their respective bottom surfaces 52c are set on the heat receiving surface 18a of the cooler 12 with an insulating sheet 55 therebetween. Thus, the first and second electrical conductors 34 and 36 are thermally connected to the cooler 12 so that heat produced in the first and second semiconductor elements 38 and 40 can be released to the cooler 12 through the electrical conductors 34 and 36. Contact portions 47a and 47b of the first and second power terminals 46a and 46b of each semiconductor module 16 contact their corresponding connecting terminals 24 of the bus bars 26 and are electrically connected to the bus bars 26. Further, the signal terminals 50 of each semiconductor module 16 project upwardly.

Each two adjacent ones of the plurality of semiconductor modules 16 arranged in a row are disposed in such a manner that the lateral surfaces of their respective molded resin bodies 52 adjacently face or contact one another. One of each two adjacent semiconductor modules 16 may be oriented inversely or at 180° to the other. The first and second power terminals 46a and 46b of the semiconductor modules are configured to reliably engage with the connecting terminals 24 of the bus bars 26 without regard to the orientation. Regardless of the orientation, also in this case, the signal terminals 50 of each semiconductor module 16 are located in the central part of the molded resin body 52 in the thickness direction and disposed in predetermined positions relative to the control circuit board 32.

As the control circuit board 32 is set on the semiconductor modules 16, as shown in FIG. 3, the end portions of the signal terminals 50 of each semiconductor module 16 are passed through through-holes in the control circuit board 32 and electrically connected to the control circuit board by solder (not shown) or the like.

The following is a description of a method of manufacturing the semiconductor modules 16 that constitute the semiconductor power converter described above. FIGS. 13 to 44 are perspective and sectional views individually showing processes of manufacturing the semiconductor modules.

Figure 14:
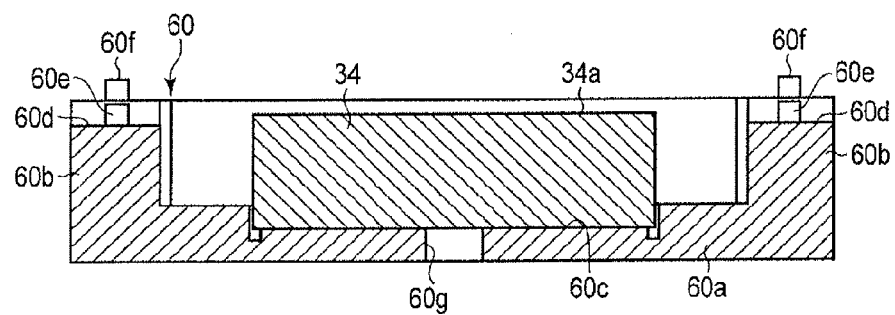
FIG. 14 is a sectional view of the first fixing jig and first electrical conductor taken along line A1-A1 of FIG. 13.

First, as shown in FIGS. 13 and 14, a first fixing jig 60 of, for example, SUS is prepared, and the first electrical conductor 34 is fitted and positioned in a positioning recess of the first fixing jig. As this is done, the first electrical conductor 34 is loaded into the first fixing jig 60 so that its joint surface 34a faces upwardly. The first fixing jig 60 is in the form of a rectangular box comprising a rectangular bottom wall 60a and a peripheral wall 60b set up along the peripheral edge of the of the bottom wall. The bottom wall 60a is formed with a rectangular positioning recess 60c of a size corresponding to the first electrical conductor 34. A through-hole 60g is formed in the center of the positioning recess 60c. In mold release, an ejector pin is passed through the through-hole 60g and pushes up and removes the first electrical conductor 34 from the first fixing jig 60. Further, the peripheral wall 60b is formed with two recesses 60d that are located on the longitudinally opposite sides of the positioning recess 60c. Two positioning pins 60e are set up at the bottom of each recess 60d. Further, the first fixing jig 60 comprises four positioning pins 60f set up at the four corners of the peripheral wall 60b.

Figure 15:
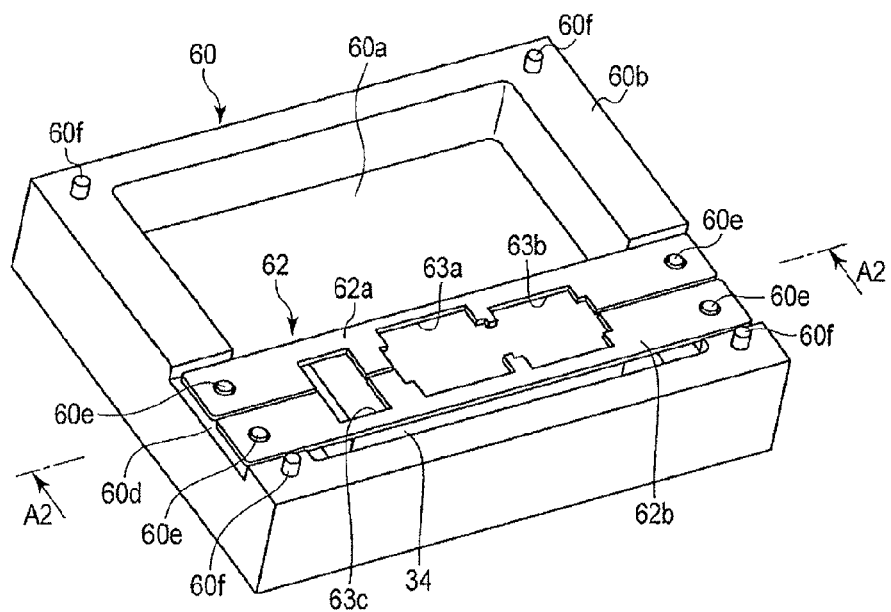
FIG. 15 is a perspective view of the first fixing jig, the first electrical conductor, and a split jig showing a process of manufacturing the semiconductor module.

Then, as shown in FIGS. 15 and 16, a split jig 62 of, for example, SUS in the form of an elongated rectangular plate is placed on joint surface 34a of the first electrical conductor 34 in such a manner that its opposite end portions are disposed within the recesses 60d of the first fixing jig 60. Further, positioning pins 60e of the first fixing jig 60 are inserted individually into positioning holes in the end portions of the split jig 62, whereupon the split jig 62 is positioned relative to the first electrical conductor 34.

The split jig 62 comprises rectangular first, second, and third openings 63a, 63b and 63c configured to position the first and second semiconductor elements and the proximal end portion of the first power terminal 46a, respectively. These openings are located above joint surface 34a. The split jig 62 is divided into two parts, first and second segments 62a and 62bs, along a center line that passes through the first to third openings. Thus, the first and second segments 62a and 62bs can be independently attached to and detached from the first fixing jig 60.

Figure 18:
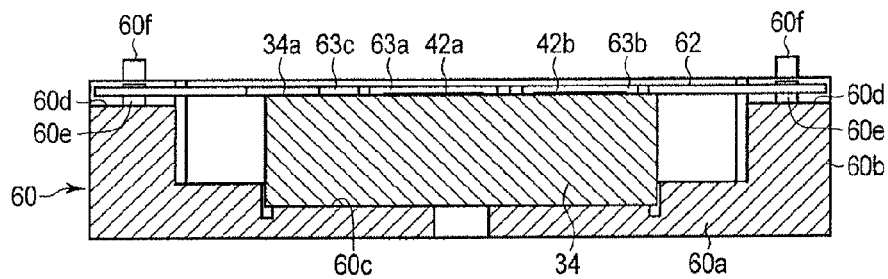
FIG. 18 is a sectional view taken along line A3-A3 of FIG. 17.

Subsequently, as shown in FIGS. 17 and 18, the first connecting body or rectangular solder sheet 42a is placed on joint surface 34a of the first electrical conductor 34 in the first opening 63a of the split jig 62. Further, the second connecting body or rectangular solder sheet 42b is placed on joint surface 34a of the first electrical conductor 34 in the second opening 63b of the split jig 62. Solder sheets 42a and 42b and a plurality of solder sheets (described later) used each contain a plurality (for example, three or more) of more particles. The inclusion of particles of a predetermined diameter keeps the height of the junction from becoming smaller than the particle diameter even after solder is melted and solidified. The particles are made of a material higher in melting temperature than the solder. Further, the particles require sufficient hardness to avoid significant change attributable to the second electrical conductor and a counterweight, and should have a diameter equal to a designed joint height.

Figure 19:
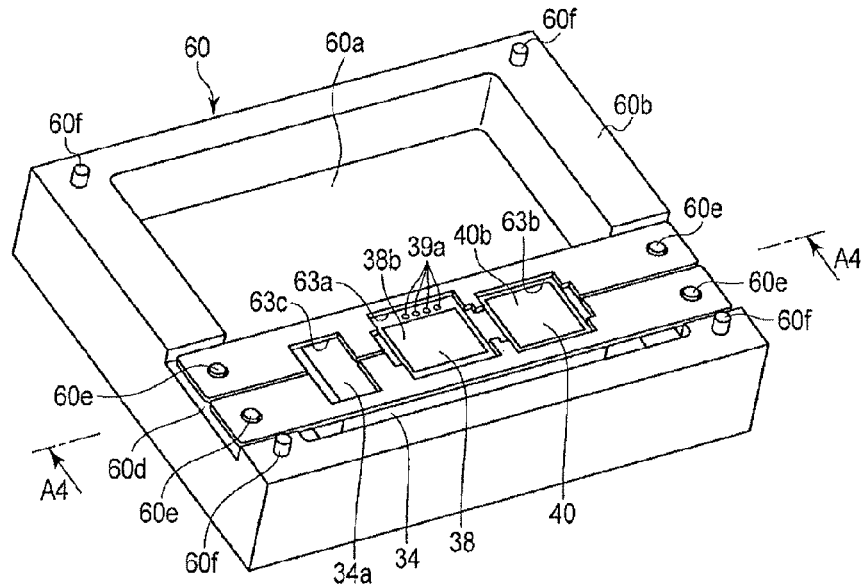
FIG. 19 is a perspective view showing how first and second semiconductor elements are placed on the first and second connecting bodies, respectively, in a process of manufacturing the semiconductor module.
Figure 20:
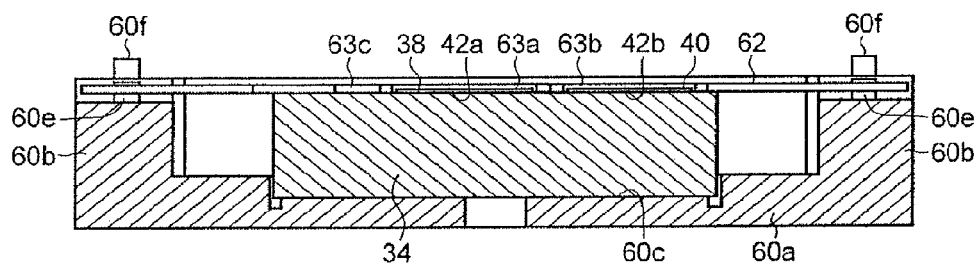
FIG. 20 is a sectional view taken along line A4-A4 of FIG. 19.

Then, as shown in FIGS. 19 and 20, the first semiconductor element 38 is placed on solder sheet 42a in the first opening 63a of the split jig 62. When this is done, the first semiconductor element 38 is placed on joint surface 34a of the first electrical conductor 34 in a parallel relationship so that its one electrode is located on solder sheet 42a. At the same time, the first semiconductor element 38 is disposed in the first opening 63a and positioned relative to the first electrical conductor 34 by the split jig 62.

The second semiconductor element 40 is placed on solder sheet 42b in the second opening 63b of the split jig 62. When this is done, the second semiconductor element 40 is placed on joint surface 34a of the first electrical conductor 34 in a parallel relationship so that its one electrode is located on solder sheet 42b. At the same time, the second semiconductor element 40 is disposed in the second opening 63b and positioned relative to the first electrical conductor 34.

Figure 21:
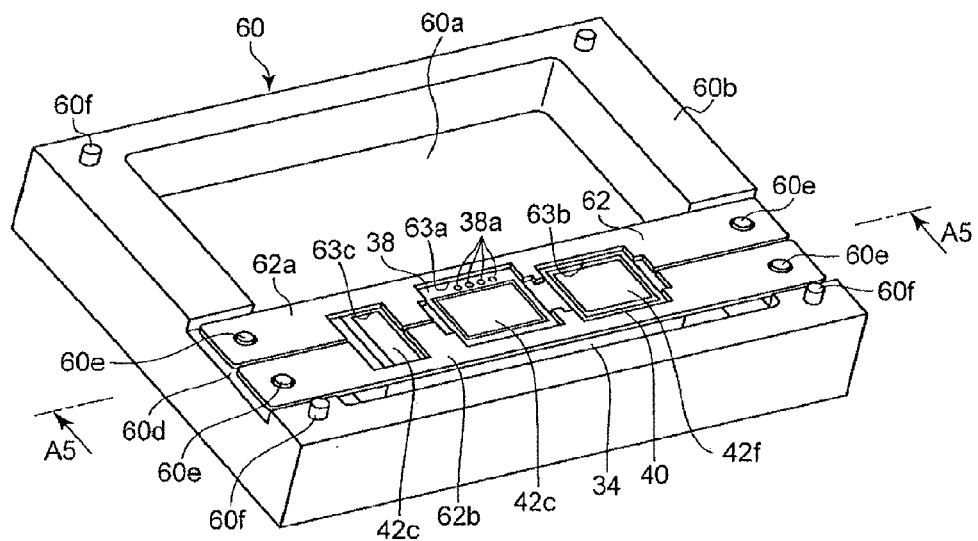
FIG. 21 is a perspective view showing how third and fourth connecting bodies are placed on the first and second semiconductor elements, respectively, in a process of manufacturing the semiconductor module.
Figure 22:
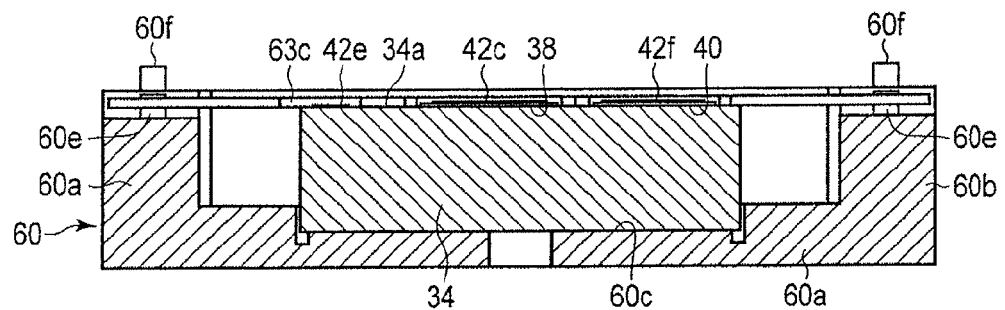
FIG. 22 is a sectional view taken along line A5-A5 of FIG. 21.

Subsequently, as shown in FIGS. 21 and 22, the third connecting body or rectangular solder sheet 42c is placed on the electrode of the first semiconductor element 38 in the first opening 63a of the split jig 62. Further, the fourth connecting body or rectangular solder sheet 42f is placed on the electrode of the second semiconductor element 40 in the second opening 63b of the split jig 62. Furthermore, the fifth connecting body or rectangular solder sheet 42e is placed on joint surface 34a of the first electrical conductor 34 in the third opening 63c of the split jig 62. Solder sheets 42c, 42f and 42e used each contain a plurality (for example, three or more) of more particles of a predetermined diameter.

Figure 23:
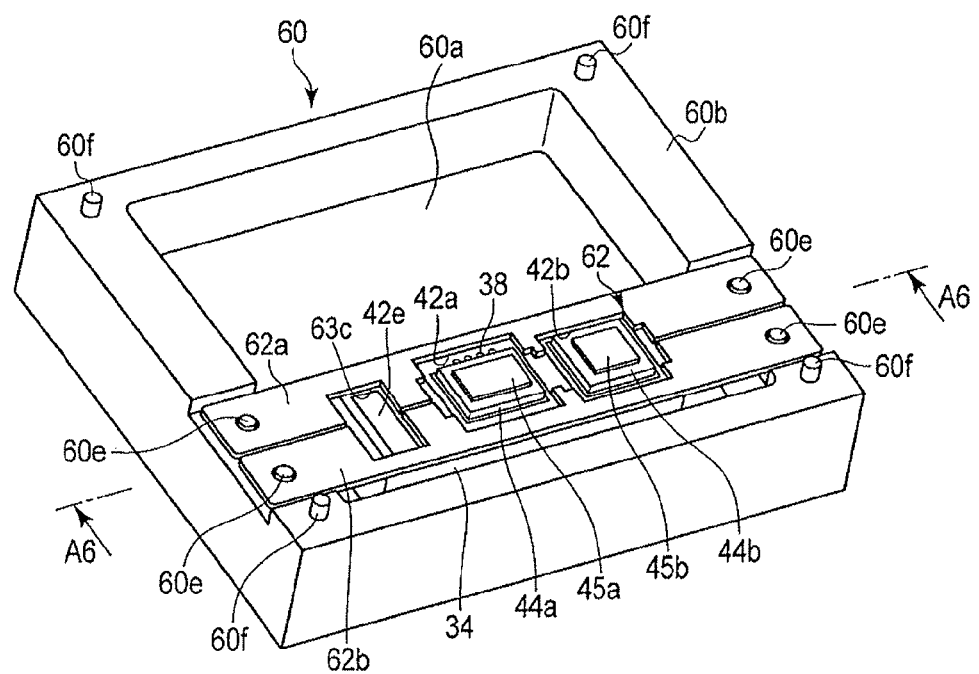
FIG. 23 is a perspective view showing how first and second convex electrical conductors are placed on the third and fourth connecting bodies, respectively, in a process of manufacturing the semiconductor module.

Then, as shown in FIGS. 23 and 24, the first convex electrical conductor 44a is placed on solder sheet 42c in the first opening 63a of the split jig 62. When this is done, the first convex electrical conductor 44a is placed so that the flat principal surface side of its main body is located above solder sheet 42c, and the upper part of the main body and projection 45a project upwardly beyond the surface of the split jig 62 from the first opening 63a.

The second convex electrical conductor 44b is placed on solder sheet 42f in the second opening 63b of the split jig 62. When this is done, the second convex electrical conductor 44b is placed so that the flat principal surface side of its main body is located above solder sheet 42f, and the upper part of the main body and projection 45b project upwardly beyond the surface of the split jig 62 from the second opening 63b. The first and second convex electrical conductors 44a and 44b are formed by stamping a metal block.

Subsequently, a lead frame 70 formed of an electrically conductive metal plate is placed on the first fixing jig 60 and first and second convex electrical conductors 44a and 44b. As shown in FIG. 25, the lead frame 70 integrally comprises a rectangular frame body 70a, the first and second power terminals 46a and 46b, the rectangular junction 48, the five signal terminals 50, connecting portions (tie-bars) 71, and a plurality of elongated connecting portions. The first power terminal 46a extends inwardly from one side portion of the frame body. The second power terminal 46b extends inwardly from the other side portion of the frame body. The junction 48 extends from the second power terminal toward the first power terminal. The signal terminals 50 extend inwardly from the other side portion of the frame body. The tie-bars 71 connect the five signal terminals 50 to one another and also to the frame body. The elongated connecting portions connect the junction 48 and frame body 70a. Of the signal terminals 50, the emitter branch (collector-emitter voltage monitor terminal) 50a extends from the junction (emitter plate) 48 and conducts to it. The other signal terminals, including the current monitor terminal 50b, gate terminal 50c, and chip temperature monitor terminals 50d and 50e, extend inwardly from the frame body 70a and are separated from the junction 48.

The junction (emitter plate) 48 is formed with the rectangular first and second openings 51a and 51b arranged side by side. The surface of the junction 48 on the side of the second electrical conductor 36 is formed with the shallow rectangular recess 56, which covers the area including the first and second openings 51a and 51b. Further, the proximal end portion of the first power terminal 46a is downwardly bent a step below by pressing or the like so that it is offset from the junction 48 toward the first electrical conductor 34 by a margin corresponding to the respective thicknesses of the first semiconductor element 38 and first convex electrical conductor 44a.

Furthermore, positioning holes 70b are formed individually at the four corners of the frame body 70a.

As shown in FIGS. 26 and 27, the lead frame 70 is disposed on the peripheral wall 60b of the first fixing jig 60, and the four positioning pins 60f of the first fixing jig 60 are passed individually through the positioning holes 70b of the lead frame 70, whereupon the lead frame 70 is positioned relative to the first fixing jig 60. The junction 48 of the lead frame 70 is placed on the first and second convex electrical conductors 44a and 44b. As this is done, the respective upper surfaces of the main bodies of the convex electrical conductors 44a and 44b contact the lower surface of the junction 48, and moreover, projections 45a and 45b are fitted in the first and second openings 51a and 51b, respectively, of the junction 48. In this way, the convex electrical conductors 44a and 44b are positioned relative to the junction 48. Further, projections 45a and 45b are exposed in the surface of the junction 48, especially in the bottom surface of the recess 56. On the other hand, the proximal end portion of the first power terminal 46a is placed on solder sheet 42e on joint surface 34a.

Figure 28:
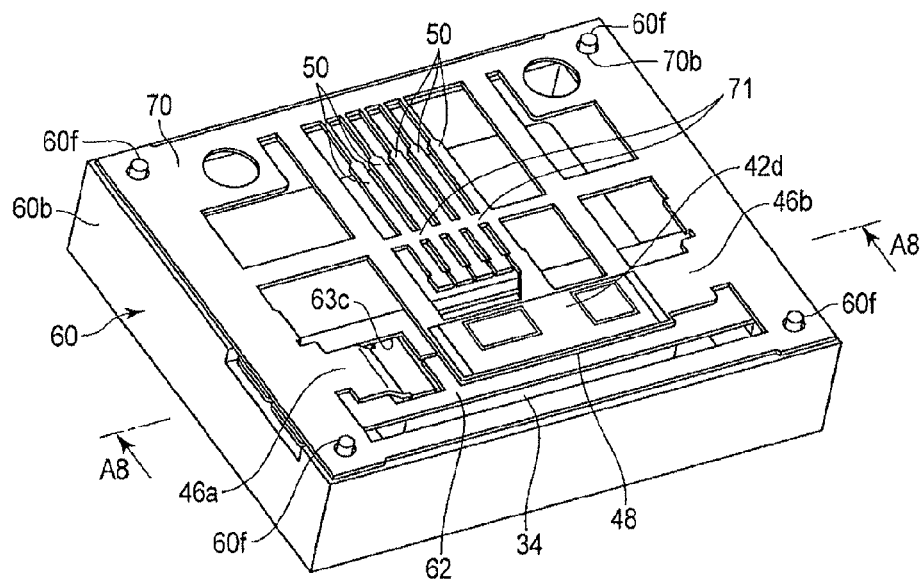
FIG. 28 is a perspective view showing how a sixth connecting body is placed on the lead frame in a process of manufacturing the semiconductor module.
Figure 29:
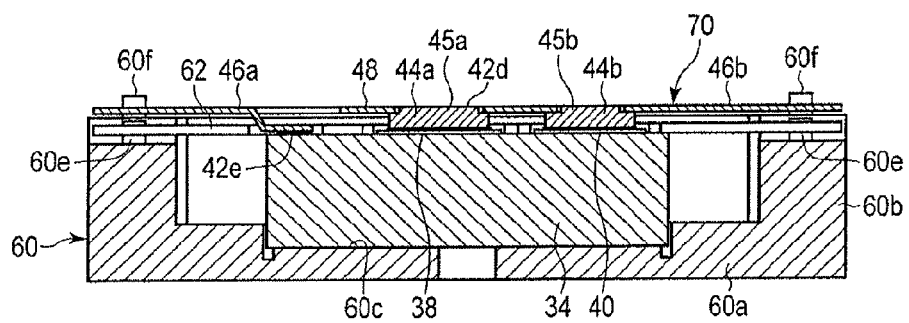
FIG. 29 is a sectional view taken along line A8-A8 of FIG. 28.

Subsequently, as shown in FIGS. 28 and 29, the elongated rectangular solder sheet 42d as the sixth connecting body is placed in the recess 56 of the junction 48. Solder sheet 42d is placed on the junction 48 and projections 45a and 45b of the first and second convex electrical conductors 44a and 44b.

As shown in FIGS. 30 and 31, a second fixing jig 80 is placed overlapping the first fixing jig 60 and lead frame 70. The second fixing jig 80 is a rectangular plate of, for example, SUS substantially as large as the first fixing jig 60, and comprises a rectangular positioning opening 80a in which the second electrical conductor can be fitted. The second fixing jig 80 is placed on the lead frame 70 in such a manner that it is positioned relative to the first fixing jig 60 with positioning pins 60f of the first fixing jig 60 engaging with engagement recesses at the four corners of the bottom surface. Thus, the second fixing jig 80 presses down and holds the lead frame 70 in a predetermined position from above. Further, the positioning opening 80a of the second fixing jig 80 is located opposite the junction 48 and solder sheet 42d.

Subsequently, as shown in FIGS. 32 and 33, the second electrical conductor 36 is fitted in the positioning opening 80a of the second fixing jig 80, placed on solder sheet 42d and junction 48, and positioned by the second fixing jig 80. When this is done, the second electrical conductor 36 is oriented so that its joint surface 36a contacts solder sheet 42d.

Figure 34:
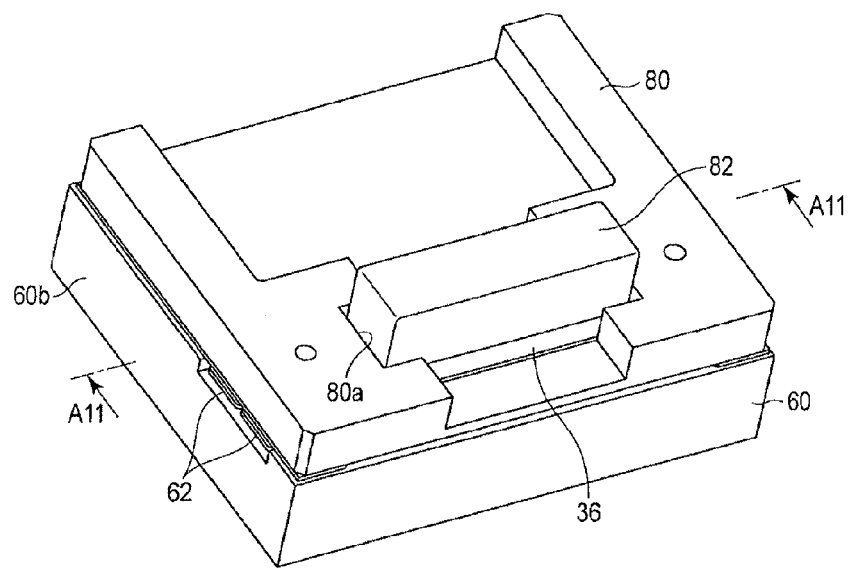
FIG. 34 is a perspective view showing how a counterweight is mounted on the second electrical conductor in a process of manufacturing the semiconductor module.
Figure 35:
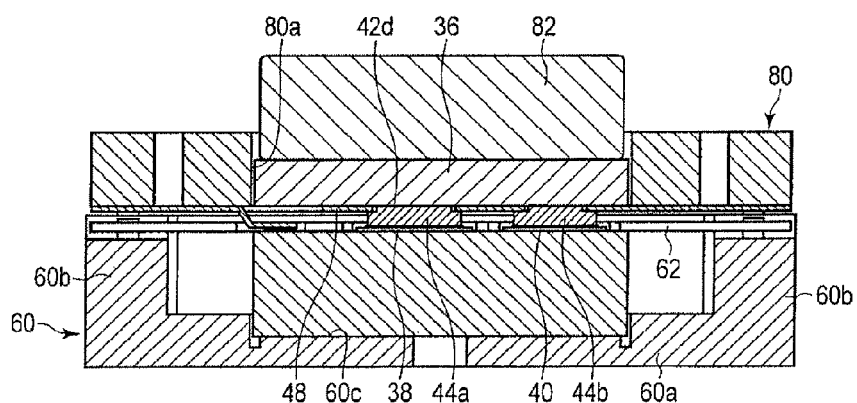
FIG. 35 is a sectional view taken along line A11-A11 of FIG. 34.

Then, as shown in FIGS. 34 and 35, a prismatic counterweight 82 is fitted in the positioning opening 80a of the second fixing jig 80 and mounted on the second electrical conductor 36. The counterweight 82 serves to press the above-described members in the direction of lamination and secure their positions. The weight of the counterweight 82 is selected so that the height of the joint portion is substantially equivalent to the size of the particles in the solder.

The constituent members and the first and second fixing jigs 60 and 80 thus laminated and positioned are heated for a predetermined time in, for example, a reflow oven, whereby solder sheets 42a to 42f are collectively melted. Thereafter, the solder sheets are cooled so that the solder is solidified, whereupon the constituent members are joined together. In the solder joining, solder sheet 42d is disposed in the recess 56 of the junction 48, so that the solder does not flows out of the recess 56 as it melts, and the constituent members can be joined in predetermined positions. As solder sheet 42d melts, moreover, it joins the junction 48, projections 45a and 45b of the first and second convex electrical conductors, and second electrical conductor 36 to one another.

After the solder sheets are melted and solidified in this manner, the counterweight 82, first and second fixing jigs 60 and 80, and split jig 62 are removed from the joined constituent members and lead frame 70, as shown in FIG. 36. Subsequently, as shown in FIG. 37, the joined constituent members and lead frame 70 are subjected to visual inspections. These inspections are conducted to see:

(A) if the semiconductor elements are not reached by the solder that joins the second electrical conductor 36 and junction 48 and projects from between them;

(B) if the second electrical conductor 36 and first power terminal 46a are in contact with each other;

(C) if there are no voids between the first electrical conductor 34 and first power terminal 46a;

(D) if the connecting terminals (pads) 38a of the first semiconductor element 38 are not reached by the solder that joins the first and second convex electrical conductors 44a and 44b and first and second semiconductor elements 38 and 40 and projects from between them; and (E) if a wire bonding area is secured.

Figure 38:
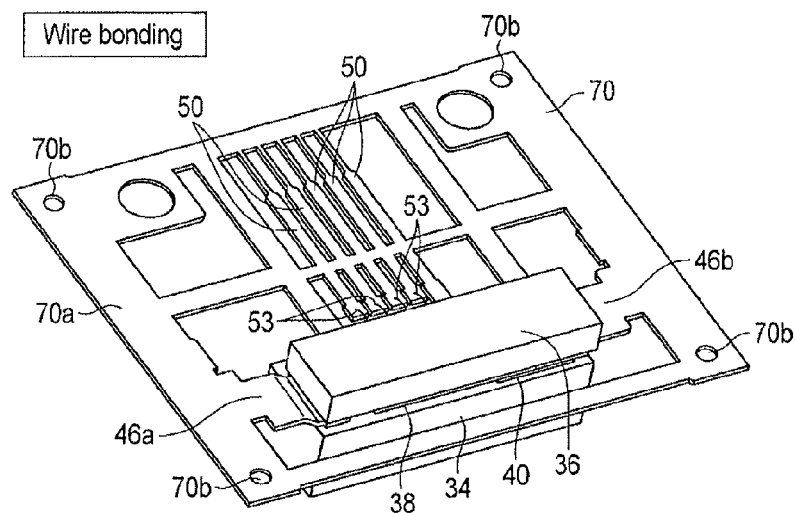
FIG. 38 is a perspective view showing a wire-bonding process in a process of manufacturing the semiconductor module.
Figure 39:
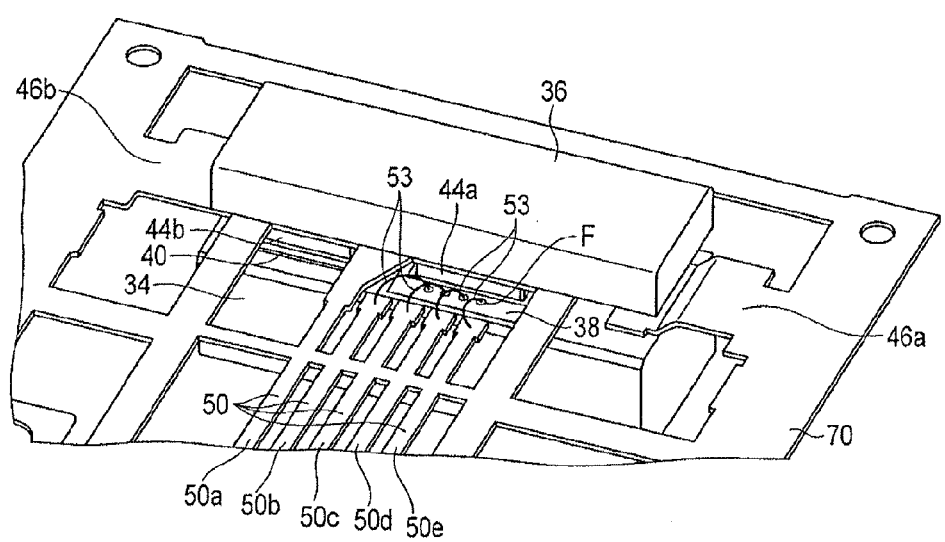
FIG. 39 is a perspective view showing a visual inspection process after wire bonding in a process of manufacturing the semiconductor module.

Subsequently, as shown in FIG. 38, the respective proximal ends of the current monitor terminal 50b, gate terminal 50c, and chip temperature monitor terminals 50d and 50e, out of the signal terminals 50, are connected to their corresponding connecting terminals 38a of the first semiconductor element 38 by the bonding wires 53. After the wire bonding, as shown in FIG. 9, a visual inspection is conducted to see (F) if there are no wire voids, if the wire loop shape is not collapsed, etc.

Then, as shown in FIG. 40, all the constituent members except the respective distal end portions of the first and second power terminals 46a and 46b and signal terminals 50 are covered and sealed by an insulating material, such as a resin. Thereupon, the substantially cuboid molded resin body (envelope) 52 is molded. This molded resin body 52 is molded by disposing the aforementioned joined laminate in a forming die and injecting a synthetic resin into the die. The forming die is released on either side of the lead frame 70, whereupon the parting line 54 flush with the lead frame 70 is formed on the molded resin body 52.

Subsequently, as shown in FIGS. 41 and 42, the lead frame 70 is cut in predetermined positions and separated from the molded resin body 52, and the five signal terminals 50 and first and second power terminals 46a and 46b are cut down. The cutting positions are indicated by broken lines in FIG. 41.

As shown in FIG. 43, the bottom surface of the molded resin body 52 is ground to form the flat bottom surface 52c perpendicular to lateral surface 52b of the molded resin body 52, and the respective bottom surfaces 34b and 36b of the first and second electrical conductors 34 and 36 are exposed in bottom surface 52c of the molded resin body 52. Bottom surfaces 34b and 36b of the electrical conductors 34 and 36 and bottom surface 52c of the molded resin body 52 are formed so that they extend perpendicular to the first and second semiconductor elements 38 and 40.

Thereafter, as shown in FIGS. 41 and 44, contact portions 47a and 47b of the first and second power terminals 46a and 46b are bent at a right angle, and each signal terminal 50 is bend-formed in two positions. The bending positions are indicated by two-dot chain lines in FIG. 41. Finally, the electrically conductive film is formed on the surface of each signal terminal 50.

The semiconductor module 16 of the power converter is completed by the processes described above.

According to the semiconductor power converter and its manufacturing method arranged in this manner, the lead frame (junction) is provided comprising the convex electrical conductors and the openings in which the projections of the convex electrical conductors are fitted, whereby the convex electrical conductors can be prevented from becoming misaligned. Further, the first and second convex electrical conductors, junction of the lead frame, and second electrical conductor can be joined by the common fifth connecting body (solder sheet), so that the connecting bodies and positions for joint soundness checks can be reduced in number.

The lead frame integrally comprises the power terminals and signal terminals and further comprises the openings for positioning the convex electrical conductors and the recesses for holding the connecting bodies. The depth of the recesses should not be greater than the joint height of the melted and solidified connecting bodies (solder sheets). The parts count can be reduced by forming the power terminals and signal terminals into an integral part (lead frame). Also, if this is done, the accuracy of the mounting positions of the power terminals and signal terminals is higher and the dimensional variation of finished products is less than in the case where the power terminals and signal terminals are handled as separate parts.

As the solder that forms the connecting bodies contains a plurality of particles, it can be controlled so that the height of the joint portion should not become smaller than the partial diameter. Thus, variation of the height of the joint portion can be reduced to improve the assembly accuracy. As the counterweight is mounted on the second electrical conductor at the time of joining, moreover, the second electrical conductor is prevented from being lifted by the surface tension of the solder, so that variation of the height of the joint portion is reduced. At the same time, the constituent parts being joined can be prevented from becoming misaligned by applying a load to the parts by means of the counterweight.

By using the split jig to position the first and second semiconductor elements during the manufacture of the semiconductor module, the jig can be easily removed even after the connecting body (solder) is solidified. If the jig is made of SUS, moreover, solder cannot easily adhere to it due to the properties of the material. The coefficient of linear expansion of SUS304 is 17.3 ppm/° C., which is approximate to that of copper, 16.7 ppm/° C. If the jig is made of SUS, therefore, it can be prevented from biting a part and becoming unremovable from it due to thermal expansion or contraction, which may otherwise be caused by a temperature difference as the solder melts and solidifies.

Thus, there may be provided a semiconductor power converter, capable of being downsized and improved in reliability and high in product yield and finished-product dimensional stability, and a method of manufacturing the same.

The following is a description of a method of manufacturing a semiconductor power converter according to an alternative embodiment. In the description of this alternative embodiment to follow, like reference numbers are used to designate the same parts as those of the foregoing first embodiment, and a detailed description thereof is omitted. The following is a detailed description focused on different parts.

Second Embodiment

According to a second embodiment, as in the first embodiment described above, various constituent members of a semiconductor module 16 are joined together in the processes shown in FIGS. 13 to 40. Thereafter, most of the constituent members including semiconductor elements are covered and sealed by a molded resin body (envelope) 52, as shown in FIG. 46. Signal terminals 50 and first and second power terminals 46a and 46b extend outwardly from the molded resin body 52.

Then, as shown in FIGS. 47 to 49, a lead frame 70 is cut in predetermined positions and separated from the molded resin body 52. The cutting positions are indicated by broken lines in FIG. 47. In the present embodiment, all other parts of the lead frame 70 than a junction 48, the first and second power terminals 46a and 46b, the signal terminals 50, and connecting portions (tie-bars) 71 connecting the signal terminals are cut off. Specifically, five signal terminals 50a, 50b, 50c, 50d and 50e are cut down from the lead frame 70 in such a manner that they are connected to one another by the connecting portions 71.

Subsequently, as shown in FIG. 50, the bottom surface of the molded resin body 52 is ground, with the five signal terminals 50a to 50e kept connected by the connecting portions 71, to form a flat bottom surface 52c perpendicular to a lateral surface 52b of the molded resin body 52. Also, respective bottom surfaces 34b and 36b of first and second electrical conductors 34 and 36 are exposed in bottom surface 52c of the molded resin body 52. Bottom surfaces 34b and 36b of the electrical conductors 34 and 36 and bottom surface 52c of the molded resin body 52 are formed so that they extend perpendicular to first and second semiconductor elements 38 and 40.

Thereafter, as shown in FIG. 4, the tie-bars 71 that connect the five signal terminals 50 are cut off, contact portions 47a and 47b of the first and second power terminals 46a and 46b are bent at a right angle, and each signal terminal 50 is bend-formed in two positions. The bending positions are indicated by two-dot chain lines in FIG. 47. Finally, an electrically conductive film is formed on the surface of each signal terminal 50.

The semiconductor module 16 of a power converter is completed by the processes described above. The tie-bars 71 may be cut off after the signal terminals 50 are bend-formed or after the electrically conductive film is formed. In short, the cutting should only be performed after the bottom surface of the molded resin body is ground and before a continuity test is started.

In many cases, a grinder is not entirely grounded in the process of grinding the bottom surface of the molded resin body 52 for exposure. During transportation, moreover, static electricity may possibly be produced by a systematic or human cause. According to the manufacturing method of the second embodiment, therefore, the connecting portions 71 are left in the process of cutting the lead frame 70 so that they can be cut after the process of grinding the bottom surface of the molded resin body. In this way, the semiconductor element can be protected from electrostatic breakdown. The connecting portions 71 are cut in a lead foaming process. Since the forming die is grounded, however, static electricity is released from the die to the ground.

If static electricity is applied to connecting terminals 38a of the semiconductor element with the connecting terminals 38a and signal terminals 50 connected by bonding wires 53 and with the tie-bars cut, there is a possibility of the semiconductor element being broken. More specifically, if the signal terminals are subjected to a high potential by the static electricity such that a potential difference from the second electrical conductor 36 is produced, a voltage higher than the withstand voltage is applied to and breaks the intervening semiconductor element. In order to avoid such electrostatic breakdown, it is effective to short-circuit the signal terminals 50 including the emitter branch 50a, thereby providing a channel in which high voltage is not applied to the semiconductor element and discharging the static electricity, as in the present embodiment. Thus, according to the second embodiment, there may be provided a method of manufacturing a semiconductor power converter, in which the semiconductor element can be reliably prevented from being damaged by static electricity, and the product yield and reliability can be improved.

The same functions and effects as those of the first embodiment described above can also be obtained from the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the sizes, shapes, etc., of the constituent members of the power converter are not limited to those of the embodiments described above and may be variously changed depending on the design.

What is claimed is:

1. A method of manufacturing a semiconductor power converter, comprising:
   mounting a first connecting body and a second connecting body on a first joint surface of a first electrical conductor;
   mounting a plate-shaped first semiconductor element, which comprises different electrodes on the obverse and reverse surfaces thereof, on the first connecting body so that one of the electrodes contacts the first connecting body;
   mounting a plate-shaped second semiconductor element, which comprises different electrodes on the obverse and reverse surfaces thereof, on the second connecting body so that one of the electrodes contacts the second connecting body;
   mounting a third connecting body on the other electrode of the first semiconductor element;
   mounting a fourth connecting body on the other electrode of the second semiconductor element;
   mounting a fifth connecting body on the first joint surface of the first electrical conductor;
   mounting a first convex electrical conductor comprising a projection on the third connecting body;
   mounting a second convex electrical conductor comprising a projection on the fourth connecting body;
   mounting on the fifth connecting body a first power terminal of a lead frame, which comprises a plate-shaped junction comprising a first opening engageable with the projection of the first convex electrical conductor and a second opening engageable with the projection of the second convex electrical conductor, the first power terminal, a second power terminal, and a plurality of signal terminals, in such a manner that the projections of the first and second convex electrical conductors are fitted in the first and second openings of the lead frame, respectively;
   mounting a sixth connecting body overlapping the projections of the first and second convex electrical conductors on the junction of the lead frame;
   mounting a second electrical conductor comprising a second joint surface on the sixth connecting body so that the second joint surface faces the first joint surface of the first electrical conductor;

collectively melting and then solidifying the first to sixth connecting bodies and joining the first electrical conductor, the first and second semiconductor elements, the first and second convex electrical conductors, the first power terminal, the junction, and the second electrical conductor to one another;

connecting the signal terminals and connecting terminals of the first semiconductor element by means of lead wires;

forming an envelope by covering and sealing respective proximal end portions of the first and second power terminals, proximal end portions of the signal terminals, and the other constituent members with an insulating material;

cutting off other parts of the lead frame than the junction, the first and second power terminals, and the signal terminals;

grinding the envelope to form a bottom surface which extends perpendicular to the first and second semiconductor elements and in which respective bottom surfaces of the first and second electrical conductors are exposed; and bend-forming the first and second power terminals and the signal terminals.

2. The method of manufacturing a semiconductor power converter of claim 1, wherein the first convex electrical conductor, the junction of the lead frame, and the second joint surface of the second electrical conductor are joined to one another by the sixth connecting body.

3. The method of manufacturing a semiconductor power converter of claim 2, wherein the junction of the lead frame is formed with a recess in an area including the first and second openings, and the sixth connecting body is mounted in the recess.

4. The method of manufacturing a semiconductor power converter of claim 1, wherein solder containing a plurality of particles is used for the first to sixth connecting bodies.

5. A method of manufacturing a semiconductor power converter, comprising:

mounting a first connecting body and a second connecting body on a first joint surface of a first electrical conductor;

mounting a plate-shaped first semiconductor element, which comprises different electrodes on the obverse and reverse surfaces thereof, on the first connecting body so that one of the electrodes contacts the first connecting body;

mounting a plate-shaped second semiconductor element, which comprises different electrodes on the obverse and reverse surfaces thereof, on the second connecting body so that one of the electrodes contacts the second connecting body;

mounting a third connecting body on the other electrode of the first semiconductor element;

mounting a fourth connecting body on the other electrode of the second semiconductor element;

mounting a fifth connecting body on the first joint surface of the first electrical conductor;

mounting a first convex electrical conductor comprising a projection on the third connecting body;

mounting a second convex electrical conductor comprising a projection on the fourth connecting body;

mounting on the fifth connecting body a first power terminal of a lead frame, which comprises a plate-shaped junction comprising a first opening engageable with the projection of the first convex electrical conductor and a second opening engageable with the projection of the second convex electrical conductor, the first power terminal, a second power terminal, a branch signal terminal diverging from the junction and a plurality of other signal terminals, and connecting portions connecting the branch signal terminal and the signal terminals to one another, in such a manner that the projections of the first and second convex electrical conductors are fitted in the first and second openings of the lead frame, respectively;

mounting a sixth connecting body overlapping the projections of the first and second convex electrical conductors on the junction of the lead frame;

mounting a second electrical conductor comprising a second joint surface on the sixth connecting body so that the second joint surface faces the first joint surface of the first electrical conductor;

collectively melting and then solidifying the first to sixth connecting bodies and joining the first electrical conductor, the first and second semiconductor elements, the first and second convex electrical conductors, the first power terminal, the junction, and the second electrical conductor to one another;

connecting the signal terminals and connecting terminals of the first semiconductor element by means of lead wires;

forming an envelope by covering and sealing respective proximal end portions of the first and second power terminals, proximal end portions of the signal terminals, and the other constituent members with an insulating material;

cutting off other parts of the lead frame than the junction, the first and second power terminals, the connecting portions, and the signal terminals;

grinding the envelope to form a bottom surface which extends perpendicular to the first and second semiconductor elements and in which respective bottom surfaces of the first and second electrical conductors are exposed; and cutting off the connecting portions after the bottom surface is formed.

6. The method of manufacturing a semiconductor power converter of claim 5, wherein the first convex electrical conductor, the junction of the lead frame, and the second joint surface of the second electrical conductor are joined to one another by the sixth connecting body.

7. The method of manufacturing a semiconductor power converter of claim 6, wherein the junction of the lead frame is formed with a recess in an area including the first and second openings, and the sixth connecting body is mounted in the recess.

8. The method of manufacturing a semiconductor power converter of claim 5, wherein solder containing a plurality of particles is used for the first to sixth connecting bodies.

* * * * *